(12) United States Patent
Shu et al.

(10) Patent No.: US 11,296,680 B2
(45) Date of Patent: Apr. 5, 2022

(54) METHODS AND APPARATUS TO IMPLEMENT TEMPERATURE INSENSITIVE THRESHOLD DETECTION FOR VOLTAGE SUPERVISORS

(71) Applicant: TEXAS INSTRUMENTS INCORPORATED, Dallas, TX (US)

(72) Inventors: Keliu Shu, Frisco, TX (US); Yanqing Li, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/180,335

(22) Filed: Feb. 19, 2021

(65) Prior Publication Data
US 2021/0265983 A1 Aug. 26, 2021

Related U.S. Application Data

(60) Provisional application No. 62/978,916, filed on Feb. 20, 2020.

(51) Int. Cl.
| | |
|---|---|
| *H03K 17/22* | (2006.01) |
| *H03L 7/00* | (2006.01) |
| *H03K 3/011* | (2006.01) |
| *H03K 17/687* | (2006.01) |
| *H03K 5/24* | (2006.01) |

(52) U.S. Cl.
CPC .............. *H03K 3/011* (2013.01); *H03K 5/24* (2013.01); *H03K 17/6871* (2013.01)

(58) Field of Classification Search
None
See application file for complete search history.

(56) References Cited

U.S. PATENT DOCUMENTS

| | | | | |
|---|---|---|---|---|
| 7,564,279 | B2 * | 7/2009 | Tang | H03K 17/223 327/142 |
| 9,270,265 | B2 * | 2/2016 | Nakamoto | H03K 17/223 |
| 9,515,648 | B2 * | 12/2016 | Chi | G06F 1/24 |

FOREIGN PATENT DOCUMENTS

DE 10156812 7/2003

OTHER PUBLICATIONS

Toru Tanzawa, "A process- and temperature-tolerant power-on reset circuit with a flexible detection level higher than the bandgap voltage," IEEE ISCAS, pp. 2302-2305 Jun. 2008, 5 pages.

* cited by examiner

*Primary Examiner* — Kenneth B Wells
(74) *Attorney, Agent, or Firm* — Mark Allen Valetti; Charles A. Brill; Frank D. Cimino

(57) ABSTRACT

Methods, apparatus, and systems are disclosed for voltage supervisors. An example apparatus includes a first switch having a first source, a first drain, and a first gate, a first resistor having a first terminal and a second terminal, the first terminal coupled to the first source and second terminal coupled to the first drain, a second resistor having a third terminal and a fourth terminal, the third terminal coupled to the second terminal, a third resistor having a fifth terminal and a sixth terminal, the fifth terminal coupled to the fourth terminal, a fourth resistor having a seventh terminal and an eighth terminal, the seventh terminal coupled to the sixth terminal, a second switch having a second source, a second drain, and a second gate, the second source coupled to the seventh terminal, and a comparator having an output, the output coupled to the first gate and the second gate.

20 Claims, 5 Drawing Sheets

US 11,296,680 B2

METHODS AND APPARATUS TO IMPLEMENT TEMPERATURE INSENSITIVE THRESHOLD DETECTION FOR VOLTAGE SUPERVISORS

RELATED APPLICATION

This patent arises from a continuation of U.S. Provisional Patent Application Ser. No. 62/978,916, which was filed on Feb. 20, 2020. U.S. Patent Provisional Application Ser. No. 62/978,916 is hereby incorporated herein by reference in its entirety. Priority to U.S. Provisional Patent Application Ser. No. 62/978,916 is hereby claimed.

FIELD OF THE DISCLOSURE

This disclosure relates generally to voltage supervisors, and, more particularly, to methods and apparatus to implement temperature insensitive threshold detection for voltage supervisors.

SUMMARY

An apparatus includes a first switch having a first source terminal, a first drain terminal, and a first gate terminal. The apparatus includes a first resistor having a first resistor terminal and a second resistor terminal. The first resistor terminal is coupled to the first source terminal and the second resistor terminal is coupled to the first drain terminal. The apparatus includes a second resistor having a third resistor terminal and a fourth resistor terminal. The third resistor terminal is coupled to the second resistor terminal. The apparatus includes a third resistor having a fifth resistor terminal and a sixth resistor terminal. The fifth resistor terminal is coupled to the fourth resistor terminal. The apparatus includes a fourth resistor having a seventh resistor terminal and an eighth resistor terminal. The seventh resistor terminal is coupled to the sixth resistor terminal. The apparatus includes a second switch having a second source terminal, a second drain terminal, and a second gate terminal. The second source terminal is coupled to the seventh resistor terminal. The apparatus includes a comparator having an output. The output is coupled to the first gate terminal and the second gate terminal.

BACKGROUND

Many modern electronic systems (such as mobile phones, laptops, vehicles, televisions, gaming systems, etc.) include multiple power rails for powering electronic system components and subsystems. The multiple power rails may be configured to provide component and/or subsystem isolation or to supply, different supply voltages for different components and/or subsystems, etc. Power supply supervision in such electronic systems may involve monitoring each of the power rails to determine whether they are operating within desired voltage ranges (i.e., in-regulation). Furthermore, power supply sequencing may be required in electronic systems to ensure that the power supplies corresponding to the various power rails are enabled in a proper order. In many existing electronic systems having multiple power rails, power supply supervision is implemented as a separate system function commonly referred to as a supply voltage supervisor.

BRIEF DESCRIPTION OF THE DRAWINGS

The same reference numbers are used in the drawings to depict the same or similar (by function and/or structure) features. The figures are not to scale.

DETAILED DESCRIPTION

Figure 1:
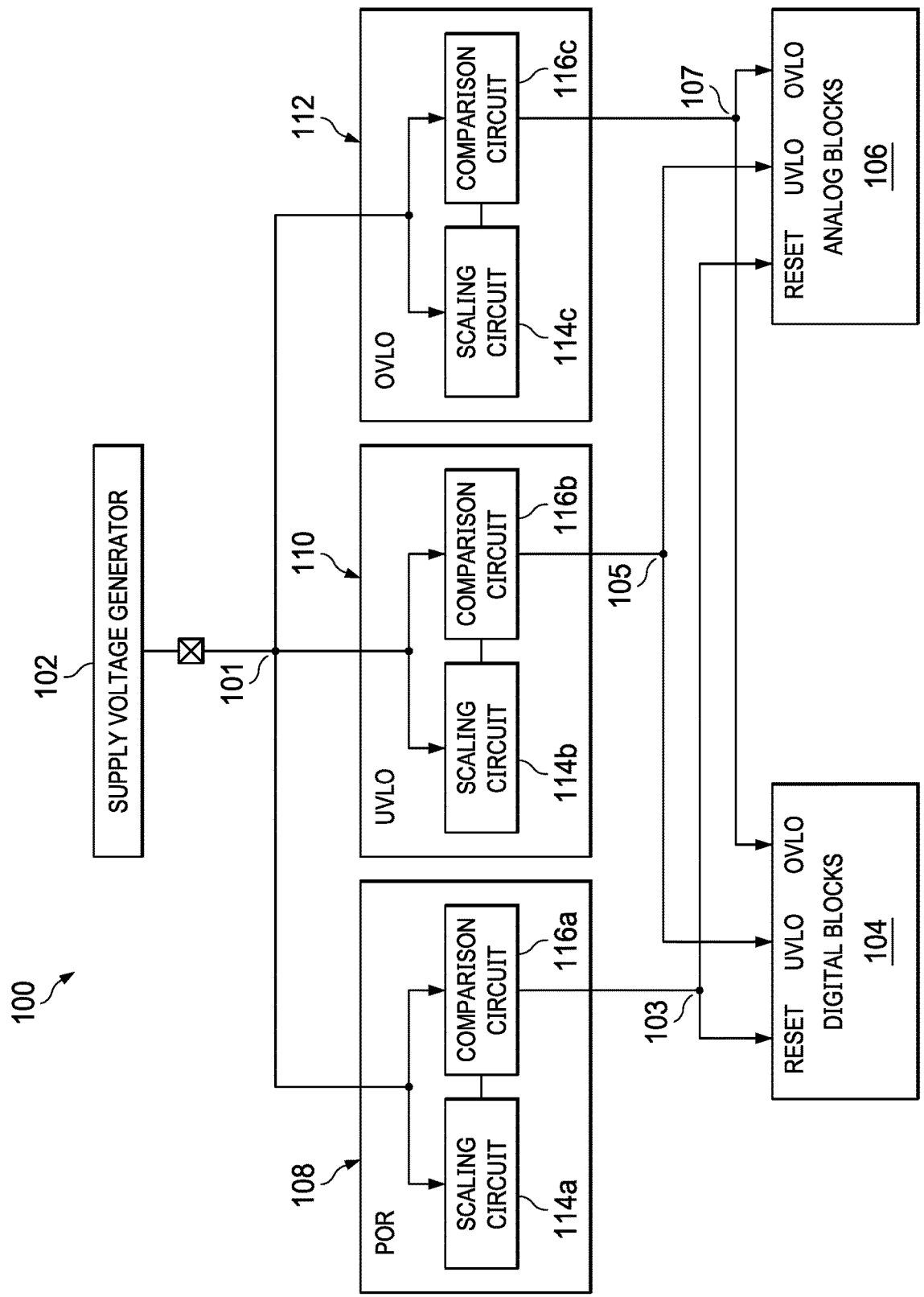
FIG. 1 is a block diagram of an example system that implements different types of voltage supervisors.

As used herein, references to connections (e.g., attached, coupled, connected, and joined) are to be construed in light of the specification and, when pertinent, the surrounding claim language. Construction of connection references in the present application shall be consistent with the claim language and the context of the specification which describes the purpose for which various elements are connected. As such, connection references do not necessarily infer that two elements are directly connected and in fixed relation to each other.

Descriptors first, second, third, etc., are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

Power on reset (POR) devices and under/over voltage lock out (UVLO/OVLO) devices are devices (e.g., systems) that implement supply voltage supervision. A POR device generates resetting signals whenever the supply voltage reaches a certain threshold required by a device configured to receive the supply voltage (e.g., a subsystem). In some examples, POR devices are utilized by logic control circuits in digital and analog subsystems of an electronic device. A UVLO device shuts down (e.g., turns off) the device (such as, DC-DC converter, power switch, amplifier, central processing unit (CPU), accelerator, etc.) configured to receive the supply voltage in response to the supply voltage dropping below a certain threshold voltage. An OVLO devices shuts down (e.g., turns off) the device (such as, DC-DC converter, power switch, amplifier, central processing unit (CPU), accelerator, etc.) intended to receive the supply voltage when the supply voltage rises above a certain threshold voltage.

A common factor required by all three voltage supervision aspects described above is threshold voltage. The threshold voltage is an important factor in voltage supervision because the accuracy of the threshold voltage can greatly impact the operation of the device intended to receive the supply voltage. For example, a UVLO device is fabricated for monitoring supply voltage to a DC-DC converter, where 1.8 volts of supply voltage is used for operation of the DC-DC converter. In such an example, if the UVLO device has a threshold voltage that ranges from 1.7 volts to 1.8 volts, the UVLO device may fail to shut down the DC-DC converter when the supply voltage drops below 1.8 volts because the threshold voltage is 1.7 volts. Failing to shut down the DC-DC converter can cause physical damage to the components within device, function failure, performance loss, etc., which are all undesirable. Therefore, devices implementing voltage supervision are designed to produce accurate (e.g., less than 5% tolerance) and precise threshold voltages (e.g., a range between 1.95V volts and 2.0 volts) for comparison to supply voltages.

In some examples, temperature, process, and component variations may affect the precision and/or accuracy of the threshold voltages implemented and/or generated by the voltage supervisors. In some conventional voltage supervisors, a bandgap reference is utilized to minimize and/or eliminate temperature dependent threshold voltages. A bandgap reference is a temperature independent voltage reference circuit that generates a fixed voltage regardless of power supply variations, temperature changes, and circuit loading. However, bandgap references may add undesired complexity, latency, and extra costs to the voltage supervisors.

Therefore, some voltage supervisors do not use bandgap references. In some examples, the voltage supervisor includes a comparator that compares two voltages generated by a bipolar transistor pair, responsive to a supply voltage. When the two voltages are equal, the comparator toggles. In examples disclosed herein, a toggling point of the comparator can be referred to as the threshold voltage. For example, when the supply voltage meets the threshold voltage, the comparator toggles. In these recent voltage supervisors, the threshold voltage may be subject to variation (e.g., may change) depending on the temperature of the bipolar transistors and other components used to design the voltage supervisor.

In some examples, the threshold voltage is temperature insensitive when temperature coefficients of a difference in up-scaled base to emitter voltage (ΔVbe) between two transistors (e.g., a difference in base to emitter voltage that is increased based on a resistor ratio) and the base to emitter voltage (Vbe) of one of the transistors cancel out. However, the threshold voltage will be temperature dependent when the temperature coefficients of two voltages do not cancel. For example, at voltages greater than a bandgap voltage (e.g., 1.2 volts, an industry standard), the base to emitter voltage, Vbe, may have a negative temperature coefficient that does not match the positive temperature coefficient of the up-scaled difference in base to emitter voltage between two transistors. In some examples, the two voltages (up-scaled ΔVbe and Vbe) only cancel when the threshold value is equal to the bandgap voltage (e.g., approximately 1.2 volts). Therefore, in recent voltage supervisors, if the threshold voltage is above or below the bandgap voltage, the threshold voltage may be subject to variation when temperature increases and/or decreases from room temperature (e.g., normal operating temperature). For example, when the threshold voltage is above the bandgap voltage of the circuit, there is a positive temperature coefficient (e.g., threshold voltage increases when temperature increases) and when the threshold voltage is below the bandgap voltage, there is a negative temperature coefficient (e.g., the threshold voltage decreases when temperature increases). The more that the threshold voltage deviates from the bandgap, the larger the temperature coefficient.

Examples disclosed herein include a scaling circuit, implemented by a voltage supervisor, that can generate a temperature insensitive threshold voltage above the bandgap voltage. Examples disclosed herein solve the problem of when the threshold voltage of the voltage supervisor is above the bandgap voltage (e.g., 1.2 volts) and the circuit is subject to temperatures greater than or less than room temperature. In examples disclosed herein, if the voltage supervisor is required to toggle and/or trip (e.g., providing an output indicative of the supply voltage) at a voltage that is above the bandgap voltage, then the described approach could do so. The detection circuit disclosed herein causes the voltage supervisor to toggle at a threshold voltage that is an upscaled version of the bandgap voltage (e.g., a threshold voltage that is greater than the bandgap voltage) and includes a very low temperature coefficient (e.g., a temperature coefficient with a temperature variation less than ±1% over −40° C. to 125° C.).

The example scaling circuit includes a number of resistors that are tuned to scale the bandgap voltage. The number of resistors are tuned based on the desired threshold voltage. For example, the desired threshold voltage is utilized to determine appropriate resistor values, wherein appropriate resistor values are ones that generate temperature independent and/or temperature insensitive voltages when the supply voltage is at the desired threshold. In other examples, the scaling circuit includes a number of resistors that are tuned based on desired hysteresis of two threshold voltages. For example, the scaling circuit implements hysteresis for a rising threshold voltage and a falling threshold voltage in order to avoid oscillation at an output of the voltage supervisor when the supply voltage is near the threshold voltage with noise and ripple. The rising threshold voltage is greater than the falling supply threshold, and the difference between the two threshold voltages is the hysteresis. In examples disclosed here, the scaling circuit ensures that the rising threshold voltage, the falling threshold voltage, and the hysteresis are all insensitive to temperature variation.

FIG. 1 is a block diagram of an example system 100 that implements different types of voltage supervisors. The example system 100 includes an example supply voltage generator 102, example digital blocks 104, example analog blocks 106, an example first voltage supervisor 108, an example second voltage supervisor 110, and an example third voltage supervisor 112. In the example of FIG. 1, the first voltage supervisor 108 is a power-on reset (POR) circuit, the second voltage supervisor 110 is an under voltage lockout (UVLO) circuit, and the third voltage supervisor 112 is an over voltage lockout (OVLO) circuit.

The system 100 may be any type of power operated device, such as a computer, a telephone, a television, a smart watch, etc. The system 100 is powered by the supply voltage generator 102 (which may include a power supply generator such as a battery, direct current (DC) power supply and/or a regulator, such as a low drop-out (LDO), buck, boost, or buck-boost regulator). The supply voltage generator 102 is configured and/or adapted to provide adequate power supply to the digital blocks 104 and the analog blocks 106 of the system 100. For example, the supply voltage generator 102 turns the digital blocks 104 and the analog blocks 106 on and off, responsive to a control signal.

The digital blocks 104 and the analog blocks 106 perform and/or execute operations for the system 100. For example, the digital blocks 104 and the analog blocks 106 include a central processing unit (CPU) core and mixed signal arrays of configurable integrated analog and digital peripherals that make up a system on a chip (SoC). An SoC is an integrated circuit that integrates all or most components of a computer or other electronic system. In some examples, the digital blocks 104 are circuit blocks and/or circuitry including state machines, logic gates, flip-flops, microcontrollers, microprocessors, etc. In some examples, the analog blocks 106 are circuit blocks and/or circuitry including electrical components such as amplifiers, power switches, etc. The digital blocks 104 and the analog blocks 106 are configured to receive supply voltage from the supply voltage generator 102. In some examples, the digital blocks 104 operate at specific specifications, such as a range of voltages (e.g., minimum and maximum supply voltage requirements), temperatures, etc. In some examples, the analog blocks 106 operate at specific specifications, different or the same as the digital blocks 104, such as a range of voltages, temperatures, etc. Due to the specific specifications and requirements of the digital blocks 104 and analog blocks 106, the system 100 includes the voltage supervisors 108, 110, and 112. While voltage supervisors 108, 110 and 112 are depicted as three separate circuit blocks and/or separated circuitry in FIG. 1, in some examples, these voltage supervisors may be implemented in fewer (e.g. one) or more circuit blocks and/or circuitry or they may be included in supply voltage generator 102.

The first voltage supervisor 108 is a POR circuit that generates reset signals whenever power is supplied to a given electrical device (e.g., the digital blocks 104 and/or the analog blocks 106). For example, the POR circuit is a circuit that provides a predictable, regulated voltage to the digital blocks 104 and the analog blocks 106 with the initial application of power. The first voltage supervisor 108 detects the level of supply voltage output by the supply voltage generator 102 and trips (e.g., toggles) when the supply voltage exceeds a threshold voltage (Vth).

The first voltage supervisor 108 includes an input terminal and an output terminal. The input terminal of the first voltage supervisor 108 is coupled to an output terminal of the supply voltage generator 102 at a first node 101. The output terminal of the first voltage supervisor 108 is coupled to a first reset terminal (e.g., a circuit block input terminal) of the digital blocks 104 and a second reset terminal (e.g., a circuit block input terminal) of the analog blocks at a second node 103.

The second voltage supervisor 110 is a UVLO circuit that turns off the power of an electronic device (e.g., the digital blocks 104 and/or the analog blocks 106) responsive to the supply voltage decreasing below an operational value. The second voltage supervisor 110 detects the level of supply voltage output by the supply voltage generator 102 and trips (e.g., toggles) when the supply voltage decreases below a threshold voltage (Vth).

The second voltage supervisor 110 includes an input terminal and an output terminal. The input terminal of the second voltage supervisor 110 is coupled to the output terminal of the supply voltage generator 102 at the first node 101. The output terminal of the second voltage supervisor 110 is coupled to a first UVLO terminal (e.g., a circuit block input terminal) of the digital blocks 104 and a second UVLO terminal (e.g., a circuit block input terminal) of the analog blocks at a third node 105.

The third voltage supervisor 112 is an OVLO circuit that turns off the power of an electronic device (e.g., the digital blocks 104 and/or the analog blocks 106) responsive to the supply voltage increasing above an operational value. The third voltage supervisor 112 detects the level of supply voltage output by the supply voltage generator 102 and trips (e.g., toggles) when the supply voltage increases above a threshold voltage (Vth).

The third voltage supervisor 112 includes an input terminal and an output terminal. The input terminal of the third voltage supervisor 112 is coupled to the output terminal of the supply voltage generator 102 at the first node 101. The output terminal of the third voltage supervisor 112 is coupled to a first OVLO terminal (e.g., a circuit block input terminal) of the digital blocks 104 and a second OVLO terminal (e.g., a circuit block input terminal) of the analog blocks at a fourth node 107.

The example voltage supervisors 108, 110, and 112 include an example first scaling circuit 114a, an example second scaling circuit 114b, an example third scaling circuit 114c, an example first comparison circuit 116a, an example second comparison circuit 116b, and an example third comparison circuit 116c. In FIG. 1, the scaling circuits 114a, 114b, and 114c generate a scaled version of the bandgap voltage when the supply voltage meets the supply threshold voltage. For example, when the supply threshold voltage is above the bandgap voltage the scaling circuits 114a, 114b, and 114c scale the bandgap voltage such that supply voltage is temperature insensitive when the supply voltage reaches the supply threshold. In this manner, there is no temperature drift at the supply threshold voltage and the voltage supervisors 108, 110, and 112 accurately toggle the output, regardless of temperature. In some examples, the amount of scaling of the bandgap voltage is based on the desired supply threshold voltage, wherein the desired supply threshold voltage is determined based on the purpose of each voltage supervisor 108, 110, 112. For example, the first voltage supervisor 108 triggers at a desired power-on-reset threshold voltage (Vth POR). In other examples, the second voltage supervisor 110 triggers at a desired under voltage lock out threshold (Vth UVLO). In other examples, the third voltage supervisor 110 triggers at a desired over voltage lock out threshold (Vth OVLO). In each example, the scaling circuits 114a, 114b, and 114c operate to scale the bandgap voltage to enable a management of temperature variation that can occur in the system 100, as described in further detail below in connection with FIG. 2.

In some examples, the scaling circuits 114a, 114b, and 114c include hysteresis. For example, hysteresis is added to the scaling of bandgap voltage to enable the voltage supervisors 108, 110, 112 to detect a different rising threshold voltage than the falling threshold voltage. In some examples, there are noise and ripple at the first node 101 from the supply voltage generator 102. If the supply voltage is around (e.g., approximately at) the threshold voltage, there may be some noise and ripple that causes the supply voltage to go up and down, which causes the voltage supervisors 108, 110, 112 to toggle back and forth. For example, if the threshold voltage is 2 volts and the supply voltage is approximately equivalent to 2 volts, noise and ripple from the supply voltage generator 102 can cause the supply voltage to go a little above 2 volts (e.g., from a few microvolts to tens of millivolts) and a little below 2 (e.g., from a few microvolts to tens of millivolts) volts for the period of time that the supply voltage is equivalent to the threshold voltage. In such examples, the output of the voltage supervisors 108, 110, 112 may toggle back and forth instead of one time for a rising supply voltage or one time for a falling supply voltage. The scaling circuits 114a, 114b, 114c therefore include circuitry that scales the supply voltage in two different ways based on whether the supply voltage is rising or falling.

In FIG. 1, the example first comparison circuits 116a is coupled to the first scaling circuit 114a, the supply voltage generator 102, the digital blocks 104, and the analog blocks 106, The example second comparison circuit 116b is coupled to the second scaling circuit 114b, the supply voltage generator 102, the digital blocks 104, and the analog blocks 106. The example third comparison circuit 116c is coupled to the third scaling circuit 114c, the supply voltage generator 102, the digital blocks 104, and the analog blocks 106. The example comparison circuits 116a, 116b, and 116c include voltage supervisor circuitry utilized for toggling the output of the voltage supervisors 108, 110, 112. For example, the comparison circuits 116a, 116b, and 116c include circuitry, described in further detail below in connection with FIG. 2, that detects the threshold voltage, set by the scaling circuits 114a, 114b, 114c, and toggles the output based on the supply voltage meeting the threshold voltage. In this manner, the comparison circuits 116a, 116b, 116c trigger at the desired supply threshold.

The digital blocks 104 and the analog blocks 106 respond to signals at the respective reset, UVLO, and OVLO terminals. For example, the digital blocks 104 power down when the second voltage supervisor 110 trips due to a decrease of supply voltage below the threshold voltage. In other examples, the analog blocks 106 power on responsive to the first voltage supervisor 108 tripping due to a supply voltage meeting the threshold voltage. In examples disclosed herein, the first, second, and third voltage supervisors 108, 110, 112 protect the digital blocks 104 and analog blocks 106 from functional failure, performance loss, device damage, etc., caused by the supply voltage being too low or too high. In some examples, the system 100 includes more than one first voltage supervisor 108 (e.g., POR circuit), more than one second voltage supervisor 110 (e.g., UVLO circuit), and/or more than one third voltage supervisor 112 (e.g., OVLO circuit). For example, the digital blocks 104 can include numerous types of state machines, where each state machine requires different specifications (e.g., different supply/operational voltages). In other examples, the analog blocks 106 can include numerous types of analog electrical components, where each component includes different specifications (e.g., different supply/operational voltages).

In examples disclosed herein, one or more of the digital blocks 104 operates at a supply voltage that is greater than a bandgap voltage (e.g., 1.2 volts). In examples disclosed herein, one or more of the analog blocks 106 operates at a supply voltage that is greater than the bandgap voltage. In examples disclosed herein, the scaling circuits 114a, 114b, 114c and the comparison circuits 116a, 116b, 116c, and/or more generally, the voltage supervisors 108, 110, and 112, generate an up-scaled version of the bandgap voltage that is used as the threshold voltage. In some examples, the scaling circuits 114a, 114b, 114c and the comparison circuits 116a, 116b, 116c, and/or more generally, the voltage supervisors 108, 110, and 112, generate two up-scaled versions of the bandgap voltage, one that is used as the threshold voltage for a rising (e.g., increasing) supply voltage and one that is used as the threshold voltage for a falling (e.g., decreasing) supply voltage. In this manner, the scaling circuits 114a, 114b, and 114c generate temperature insensitive threshold voltages that are reliable in temperature change conditions. An implementation of such scaling circuits 114a, 114b, and 114c and the comparison circuits 116a, 116b, 116c, is described in further detail below in connection with FIG. 2.

Figure 2:
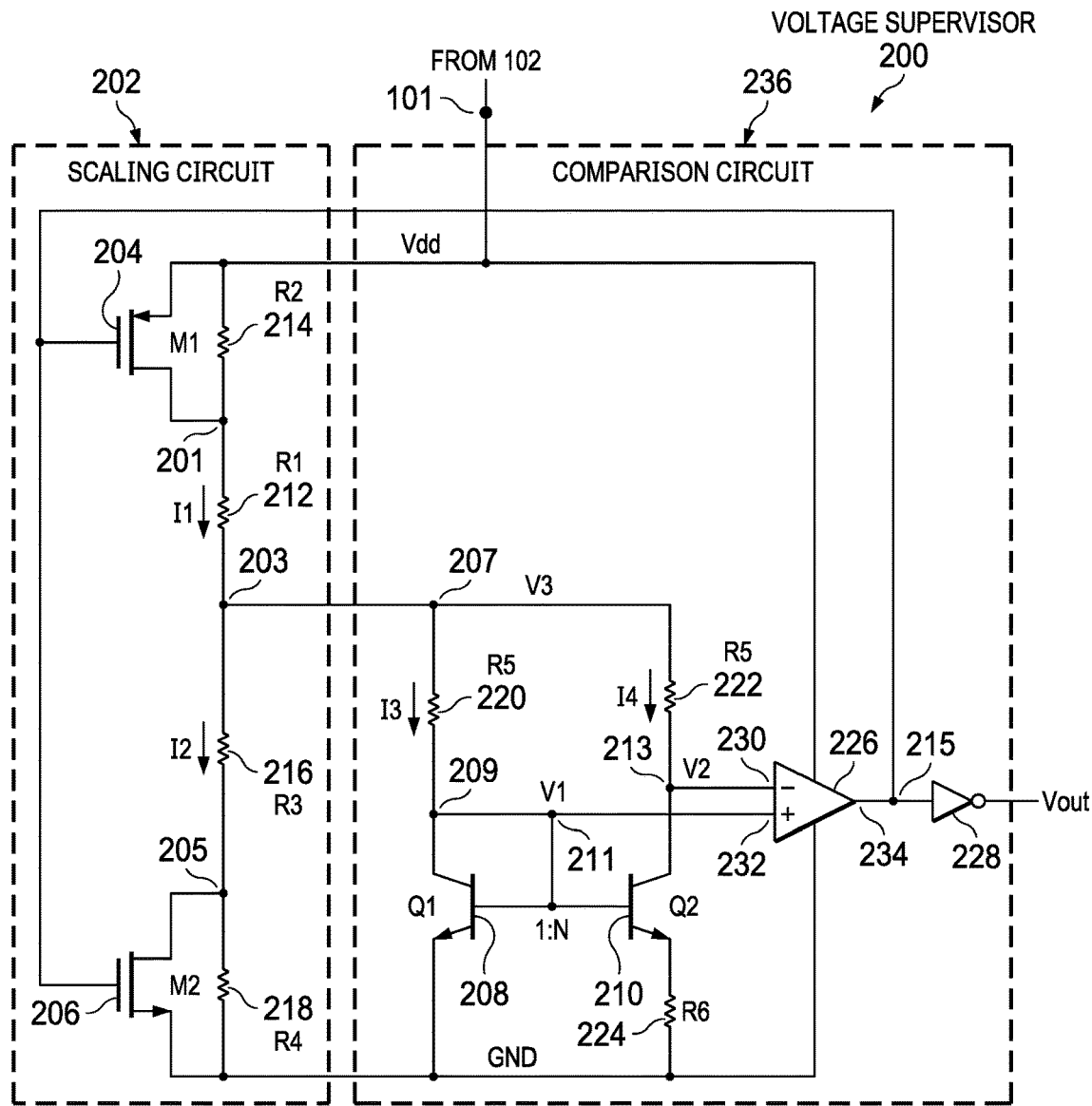
FIG. 2 is a schematic illustration of an example voltage supervisor that implements a scaling circuit for monitoring supply voltage.

FIG. 2 is a schematic illustration of an example voltage supervisor 200 implementing an example scaling circuit 202 to monitor supply voltage. The voltage supervisor 200 may be implemented by the example first voltage supervisor 108 (POR circuit), the example second voltage supervisor 110 (UVLO circuit), and/or the example third voltage supervisor 112 (OVLO circuit) of FIG. 1. In some examples, the voltage supervisor 200 monitors supply voltage output by the supply voltage generator 102 of FIG. 1. The voltage supervisor 200 includes an example first switch (M1) 204, an example second switch (M2) 206, an example first transistor (Q1) 208, an example second transistor (Q2) 210, an example first resistor (R1) 212, an example second resistor (R2) 214, an example third resistor (R3) 216, an example fourth resistor (R4) 218, example fifth resistors (R5) 220, 222, an example sixth resistor (R6) 224, an example comparator 226, and an example logic gate 228. The example first switch 204, the example second switch 206, the example first resistor 212, the example second resistor 214, the example third resistor 216, and the example fourth resistor 218 make up the example scaling circuit 202. The example first transistor (Q1) 208, the example second transistor (Q2) 210, the example fifth resistors (R5) 220, 222, the example sixth resistor (R6) 224, the example comparator 226, and the example logic gate 228 make up an example comparison circuit 236.

The first transistor 208 and the second transistor 210 are implemented by NPN bipolar junction transistors (BJTs). Alternatively, the first transistor 208 and the second transistor 210 may be implemented by a different type of transistor, such a PNP BJT, a junction gate field-effect transistor (JFET), a metal-oxide-semiconductor field-effect transistors (MOSFETs), etc. The first switch 204 is implemented by P-channel metal-oxide-semiconductor field-effect transistors (MOSFETs) (e.g., P-channel silicon MOSFETs, P-channel gallium nitride (GaN) MOSFETs, etc.). Alternatively, the first switch 204 may be implemented by a different type of transistor, such as a bipolar junction transistor (BJT), an N-channel MOSFET, a junction gate field-effect transistor (JFET), etc. The second switch 206 is implemented by an N-channel MOSFET (e.g., N-channel silicon MOSFETs, N-channel gallium nitride (GaN) MOSFETs, etc.). Alternatively, the second switch 206 may be implemented by a different type of transistor, such as a bipolar junction transistor (BJT), a P-channel MOSFET, a junction gate field-effect transistor (JFET), etc.

The second transistor 210 is N times the size of the first transistor 208. For example, the first transistor 208 is copied N times to make up second transistor 210. In such an example, if N=5, the second transistor 210 consists of (e.g., includes, is made up of, etc.) 5 copies of the first transistor 208. As used herein, N is indicative of a size ratio that indicates the difference in area between the first transistor 208 and second transistor 210. The size ratio of the transistors 208, 210 and/or the size of the second transistor 210 is selected based on device matching and the area of a chip on which the voltage supervisor 200 is designed.

In FIG. 2, the fifth resistors (R5) 220, 222 have substantially equal resistance values. For example, a first one of the fifth resistors 220 includes the same value of resistance (in ohms) as a second one of the fifth resistors 222.

In FIG. 2, the logic gate 228 is implemented by an inverter, a NOT gate, etc. Alternatively, the logic gate may be implemented by any type and/or multiple types of logic gates, such as AND gates, NOR gate, etc.

In FIG. 2, the second resistor 214 is configured and/or adapted to be coupled to the output terminal of the supply voltage generator 102 (FIG. 1) at the first node 101. Second resistor 214 is connected between the source and drain terminals of first switch 204. The first resistor 212 is coupled in series to the second resistor 214 at a fifth node 201. First resistor 212 is connected between nodes 201 and 203. The third resistor 216 is coupled in series to the first resistor 212 at a sixth node 203. The third resistor 216 is connected between node 203 and the node 205. The fourth resistor 218 is coupled in series to the third resistor 216 at a seventh node 205. The fourth resistor 218 is connected between node 205 and common potential (e.g. ground).

In FIG. 2, a first current terminal (e.g., a source terminal) of the first switch (M1) 204 is configured and/or adapted to be coupled to the output terminal of the supply voltage generator 102 (FIG. 1) at the first node 101. Additionally, the first current terminal of the first switch 204 is coupled to the first resistor terminal of the second resistor 214. The second current terminal (e.g., drain terminal) of the first switch 204 is coupled to the second resistor 214 and the first resistor 212 at the fifth node 201.

In FIG. 2, a first current terminal (e.g., a drain terminal) of the second switch (M2) 206 is coupled to the third resistor (R3) 216 and the fourth resistor (R4) 218 at the seventh node 205. The second current terminal (e.g., a source terminal) of the second switch (M2) 206 is coupled to ground.

In FIG. 2, the fifth resistors 220, 222 are coupled to the first resistor 212 and the third resistor 216 at an eighth node 207. As used herein, the potential at the sixth node 203 and the eighth node 207 is equal. Therefore, the fifth resistors 220, 222 could be coupled to the first resistor 212 and the third resistor 216 at the sixth node 203.

In FIG. 2, a collector terminal of the first transistor 208 is coupled to the first one of the fifth resistors 220 at a ninth node 209. An emitter terminal of the first transistor 208 is coupled is coupled to ground. A base terminal (e.g., a control terminal) of the first transistor 208 is coupled to the collector terminal of the first transistor 208 at a tenth node 211. The base terminal (e.g., control terminal) of the first transistor 208 may be coupled to the collector terminal of the first transistor 208 at the ninth node 209.

In FIG. 2, a collector terminal of the second transistor 210 is coupled to the second one of the fifth resistors 222 at an eleventh node 213. An emitter terminal of the second transistor 210 is coupled to the sixth resistor 224. A base terminal (e.g., control terminal) of the second transistor 210 is coupled to the base terminal (e.g., control terminal) of the first transistor 208 and, thus, coupled to the collector terminal of the first transistor 208 at the tenth node 211.

In FIG. 2, the comparator 226 includes a first input 230 (e.g., negative input, inverting input, etc.), a second input 232 (e.g., positive input, non-inverting input, etc.), and an output 234. The logic gate 228 includes a logic gate input and a logic gate output. The first input 230 of the comparator 226 is coupled to the second one of the fifth resistors 222 at the eleventh node 213. The second input 232 of the comparator 226 is coupled to first one of the fifth resistors 220 and the collector terminal of the first transistor 208 at the ninth node 209. The output 234 of the comparator 226 is coupled to the logic gate input at a twelfth node 215. The output 234 of the comparator 226 is coupled to a gate of the first switch 204 and a gate of the second switch 206 at the twelfth node 215. In the example of FIG. 2, the positive supply rail of comparator 226 is connected to node 101 and the negative supply rail is connected to ground (GND).

In FIG. 2, the logic gate 228 includes a logic gate output. The logic gate output is coupled to (e.g., adapted to be coupled to, configured to be coupled to, directly coupled to, etc.) a receiving device (e.g., the analog blocks 106 and/or the digital blocks 104 of FIG. 1).

In some examples, the voltage supervisor 200 operates to enable a first voltage (V1) at the ninth node 209 to match a second voltage (V2) at the eleventh node 213 when the supply voltage at the first node 101 is equal to the threshold voltage. Additionally, the example voltage supervisor 200 is configured to ensure that there is little to no temperature drift when the supply voltage reaches the threshold voltage, because temperature drift causes voltage variations within the voltage supervisor 200 that can cause the first voltage (V1) and the second voltage (V2) to match at an incorrect time (e.g., when the supply voltage is below the threshold voltage, above the threshold voltage, etc.).

In an example operation, the comparison circuit 236 and/or more generally, the voltage supervisor 200 is configured to toggle the comparator output 234 at a threshold voltage of 2.13 volts. For example, the combination of electrical components (e.g., the switches, transistors, and resistors) configure the first voltage (V1) to match the second voltage (V2) when the supply voltage is equal to 2.13 volts and, thus, toggle the comparator output 234. For example, the size of the first transistor (Q1) 208 and the second transistor (Q2) 210, and the sizes of the first resistor (R1) 212, the second resistor (R2) 214, the third resistor (R3) 216, the fourth resistor (R4) 218, the fifth resistors (R5) 220, 222, and the sixth resistor (R6) 224 are selected to configure the voltage supervisor 200 to toggle the comparator output 234 at the threshold voltage. In the example operation, the voltage at the first node 101 (e.g., the supply voltage, Vdd, etc.) is initially low responsive to a supply voltage generator (e.g., the supply voltage generator 102 of FIG. 1) not outputting voltage. The first transistor (Q1) 208 and the second transistor (Q2) 210 are turned off (e.g., not conducting current) when the supply voltage is low (e.g., approximately zero). The supply voltage begins to increase responsive to the supply voltage generator 102 outputting voltage. In some examples, the first transistor 208 and the second transistor 210 turn on responsive to the supply voltage increasing to a minimum threshold base-to-emitter ($V_{be}$) voltage of the first transistor 208 and second transistor 210. In some examples, gradually, there is some current flowing through the first transistor 208 and the second transistor 210 responsive to the first transistor 208 and second transistor 210 turning on. Initially, when the supply voltage is equal to the minimum threshold $V_{be}$ of the first transistor 208 and second transistor 210, the current flowing through the second transistor 210 is greater than a current flowing through the first transistor 208. For example, the bigger transistor (e.g., the second transistor 210) sinks more current than the smaller transistor (e.g., the first transistor 208) due to the bigger size of the second transistor 210. In response to more current flowing through the second transistor 210 than the first transistor 208, the voltage drop across the second one of the fifth resistors 222 is greater than the voltage drop across the first one of the fifth resistors 220. For example, a larger current I4 times the resistance of the fifth resistor 222 generates a greater voltage respective to the smaller current I3 times the resistance of the fifth resistor 220. In this manner, the second voltage (V2) at the eleventh node 213 is less than the first voltage (V1) at the ninth node 209.

In the example operation, the supply voltage at the first node 101 continues to increase. The current across the second one of the fifth resistors 222 (I4) increases in response to the supply voltage increasing. The voltage drop across the sixth resistor (R6) 224 increases in response to the collector current of the second transistor 210 (I4) increasing.

A difference in base-to-emitter voltage ($\Delta V_{be}$) of the first transistor 208 and the second transistor 210 increases as the collector current of the second transistor 210 (I4) increases. The difference in base-to-emitter voltage ($\Delta V_{be}$) of the first transistor 208 and the second transistor 210 is utilized to determine the current through the second one of the fifth transistors 222 and, thus, can be utilized to indirectly determine second voltage (V2) at the eleventh node 213. The difference in base-to-emitter voltage ($\Delta V_{be}$) of the first transistor 208 and the second transistor 210 can be determined utilizing Equation (1) below. In Equation (1), R6 is the resistance in ohms of the sixth resistor 224 and I4 is the current in amperes across the second one of the fifth resistors 222.

$$\Delta V_{be} = R6 \times I4 \tag{1}$$

In some examples, as $\Delta V_{be}$ continues to increase, the second transistor 210 reaches a point where a base-to-emitter junction can no longer compensate the $V_{be}$ difference. The $V_{be}$ of the first transistor 208 then increases responsive to the inability of the second transistor 210 to compensate the difference in $V_{be}$. When the $V_{be}$ of the first transistor 208 ($V_{be1}$) increases, the current across the first one of the fifth resistors 220 (I3) increases. In this manner, the first voltage (V1) at the ninth node 209 increases slower than the second voltage (V2) at the eleventh node 213, moving closer to the second voltage (V2). When the supply voltage is equal to the threshold supply voltage (e.g., 2.13 volts), the current through the first transistor 208 (I3) and the current through the second transistor 210 (I4) are equal.

In some examples, the current through the second transistor (Q2) 210 is I4 and can be derived from Equation 1 above by solving for I4 or can be determined utilizing Equation (2) below. The current through the second transistor (Q2) 210 (I4) is derived in order to find the comparator toggling point (i.e., the supply detection threshold). At the comparator toggling point, the current through the first transistor (Q1) 208 (e.g., current I3) is equal to the current I4. In Equation (2), V3 is a third voltage at the eighth node 207, $V_{be1}$ is the base-to-emitter voltage of the first transistor (Q1) 208, and R5 is the resistance (in ohms) of the second one of the fifth resistors 222.

$$I_4 = I_3 = \frac{V_3 - V_{be1}}{R5} \tag{2}$$

In the example operation, the third voltage (V3) can also be referred to herein as an intermediate voltage. The third voltage (V3) and/or the intermediate voltage is the result of (e.g., generated by) the scaling circuit 202. The example scaling circuit 202 implements a resistor divider to scale down the supply voltage. In examples disclosed herein, the scaling circuit 202 is implemented to ensure temperature coefficients of the up-scaled $\Delta V_{be}$ and $V_{be1}$ are balanced at the supply threshold. For example, at the supply voltage threshold ($V_{dd\_th}$), temperature coefficients of up-scaled $\Delta V_{be}$ and $V_{be1}$ are to cancel, enabling a temperature insensitive detection point. In any voltage supervisor, the toggling point (e.g., the supply threshold voltage) is derived based on making the first voltage (V1) equal to the second voltage (V2). In a conventional voltage supervisor (a voltage supervisor without the scaling circuit 202), the toggling point can be determined based on Equation (3) below. In Equation (3), $V_{be1}$ is the base to emitter voltage of a first transistor (e.g., first transistor 208) and $\Delta V_{be}$ is a difference between the base-to-emitter voltage of the first transistor (e.g., first transistor 208) and a base-to-emitter voltage of a second transistor (e.g., second transistor 210).

$$V_{dd\_th} = \frac{R_5}{R_6} \Delta V_{be} + V_{be1} \tag{3}$$

In some examples, the difference between the base-to-emitter voltage of the first transistor and the base-to-emitter voltage of the second transistor ($\Delta V_{be}$) (e.g., the first transistor 208 and second transistor 210) is based on temperature. For example, $\Delta V_{be}$ can be determined utilizing Equations (4) and (5) below. In Equation (4), $V_T$ is indicative of the thermal voltage of the two bipolar transistors (e.g., the first transistor 208 and second transistor 210) and ln(N) is the natural log of the size ratio of the two bipolar transistors.

$$\Delta V_{be} = V_T * \ln(N) \tag{4}$$

The thermal voltage ($V_T$) of the two bipolar transistors depends on the absolute temperature (T) of the conventional voltage supervisor in degrees Kelvin. For example, the thermal voltage ($V_T$) can be defined by utilizing Equation (5) below. In Equation (5) below, T is absolute temperature of the first transistor and second transistor, k is Boltzmann's constant, and q is the elementary charge (e.g., a constant).

$$V_T = \frac{k * T}{q} \tag{5}$$

In general, voltages have a negative temperature coefficient, meaning that a voltage reduces when temperature increases. Therefore, the temperature coefficient of $V_{be1}$ for the first transistor (e.g., first transistor 208) in diode-configuration (e.g., the first transistor connected as a diode because the collector is shorted with the base of first transistor 208) is negative. For example, if the current through the first transistor is constant, $V_{be1}$ decreases as temperature increases and $V_{be1}$ increases as temperature decreases. The difference in base-to-emitter voltage of the first transistor (e.g., first transistor 208) and the base-to-emitter voltage of the second transistor (e.g., second transistor 210) ($\Delta V_{be}$) has a positive temperature coefficient, meaning that $\Delta V_{be}$ increases when the temperature increases. For example, $\Delta V_{be}$ is proportional to absolute temperature, as illustrated in Equations (4) and (5) above, and, thus, increases as temperature increases and decreases as temperature decreases. The positive temperature coefficient can be designed by choosing the value of N and the resistance ratio of the fifth resistor (e.g., fifth resistor 222) and the sixth resistor (e.g., sixth resistor 224).

In some examples, temperature coefficients of $\Delta V_{be}$ and the base-to-emitter voltage of the first transistor (e.g., first transistor 208) ($V_{be1}$) cancel when the supply voltage ($V_{dd}$) is equal to a particular voltage. In conventional voltage supervisors, this particular voltage, as illustrated in Equation (3), is the bandgap voltage ($V_{BG}$). In this manner, in an operation of a conventional voltage supervisor (one without the scaling circuit 202), the comparator toggles when the supply voltage ($V_{dd}$) is equal to 1.2 volts. The supply voltage at 1.2 volts is temperature independent and, thus, will not significantly change with temperature. However, in a different operation of a conventional voltage supervisor, the comparator is configured to toggle when the supply voltage (Vdd) is above or below the bandgap voltage. In such an operation, the threshold voltage may have a positive or negative temperature coefficient, depending on whether the threshold voltage is greater than or less than the bandgap voltage.

For example, in an operation of the conventional voltage supervisor (e.g., the voltage supervisor without the scaling circuit 202) where the threshold voltage is 2.13 volts (e.g., above $V_{BG}$), the comparator toggles responsive to the supply voltage (Vdd) equaling 2.13 volts. However, at 2.13 volts, the temperature increases and so does $\Delta V_{be}$, making the temperature coefficient of up-scaled $\Delta V_{be}$ more positive than needed to cancel the negative temperature coefficients of the base to emitter voltage of the first transistor ($V_{be1}$). When the positive temperature coefficient of up-scaled $\Delta V_{be}$ is more than the negative temperature coefficient of $V_{be1}$, the temperature coefficients of two voltages (e.g., up-scaled $\Delta V_{be}$ and $V_{be1}$) do not cancel. As such, the threshold voltage has a positive temperature coefficient. The greater the threshold voltage increases above the bandgap voltage, the greater the temperature coefficient increases.

The conventional voltage supervisor (e.g., the voltage supervisor without the scaling circuit 202) is not ideal in situations where the toggling point is configured to be above or below the bandgap voltage (e.g., 1.2 volts). As described above, the threshold voltage is subject to variation when increased above and/or below the bandgap voltage, which can cause inaccurate monitoring of the supply voltage (Vdd). Inaccurate monitoring of the supply voltage (Vdd) can lead to a misrepresentation of the supply voltage (Vdd) and therefore a false indication that the supply voltage is at a level sufficient to operate a load (e.g., such as the digital blocks 104 and/or analog block 106 of FIG. 1). Examples disclosed herein and described in further detail below configure the voltage supervisor 200 to accurately represent the supply voltage for a threshold that is greater than the bandgap voltage.

In FIG. 2, the example scaling circuit 202 includes a resistor divider to scale up the bandgap voltage, such that the threshold voltage can be above the bandgap voltage and remain temperature insensitive. In examples described herein, it should be noted that the third voltage (V3) is not bandgap voltage at the comparator toggling point. For simple explanation of the resistor divider implemented by the scaling circuit 202, the following description excludes the first switch 204, the second switch 206, the second resistor 214, and the fourth resistor 218. For example, the following description is written such that the first switch 204, the second switch 206, the second resistor 214, and the fourth resistor 218 do not exist (that is, resistors 214 and 218 are shorted), and the output of the supply voltage generator 102 (FIG. 1) is coupled to the first resistor 212 (e.g., or that the second resistor 214 and first switch 204 are shorted and the fourth resistor 218 and second switch 206 are shorted to ground).

In examples disclosed herein, the scaling circuit 202 is utilized to make the threshold voltage ($V_{dd\_th}$) temperature insensitive. In some examples, the threshold voltage ($V_{dd\_th}$) is temperature insensitive by up-scaling a bandgap voltage. For example, when the supply voltage equals the bandgap voltage, the temperature coefficients of up-scaled $\Delta V_{be}$ and $V_{be1}$ cancel out, enabling the supply threshold voltage to not be affected by temperature variation. As such, to ensure that the threshold voltage, which is greater than the bandgap voltage, is not affected by temperature variation, the scaling circuit 202 determines the threshold voltage ($V_{dd\_th}$) from the bandgap voltage equation and a voltage ratio (r). The voltage ratio (r) is utilized to manipulate the supply detection threshold, such that the voltage ratio (r) up-scales the bandgap voltage. Therefore, the first resistor (R1) 212 and the third resistor (R3) 216 have specific values that are determined based on the desired toggling point (e.g., $V_{dd\_th}$) of the voltage supervisor 200. For example, the first resistor (R1) 212 and the third resistor (R3) 216 are utilized not only as a resistor divider to down-scale the supply voltage, but also as the voltage ratio (r) to up-scale the bandgap voltage ($V_{BG}$) to the desired voltage level, as shown in Equation (6) below. For example, Equation (6) below illustrates the threshold voltage equation, where the variable r is the voltage ratio and the variable $V_{BG}$ is the bandgap voltage. Equation (7) below illustrates the voltage ratio (r) to scale the bandgap voltage. In Equation (7) below, r is the voltage ratio, R1 is the resistance (in ohms) of the first resistor 212, and R3 is the resistance (in ohms) of the third resistor 216.

$$V_{dd\_th} = r * V_{BG} \tag{6}$$

$$r = 1 + \left(\frac{R1}{R3}\right) \tag{7}$$

In some examples, the voltage ratio (r) is applied to the bandgap voltage to determine the threshold voltage ($V_{dd\_th}$). Equation (8) below is the bandgap voltage equation. In Equation (8) below, m is the $\Delta V_{be}$ up-scaling factor (e.g., a constant set by Equation (9) below), $\Delta V_{be}$ is the difference in base-to-emitter voltage of the first transistor 208 and base-to-emitter voltage of the second transistor 210, and $V_{be1}$ is the base-to-emitter voltage of the first transistor 208.

$$V_{BG} = m * \Delta V_{be} + V_{be1} \tag{8}$$

In some examples, with a given size of the sixth resistor 224, the bandgap voltage equation is used to select the size of the fifth resistors 220, 222, as well as the first resistor 212 and the third resistor 216, while the ratio of the first resistor 212 and the third resistor 216 is defined in Equation (7) above. For example, the variable m can be determined by utilizing a resistor ratio of the first resistor 212, the third resistor 216, and the fifth resistors 220, 222, such as the resistor ratio illustrated in Equation (9) below. In Equation (9) below, R5 is the resistance (in ohms) of the fifth resistors 220, 222, R1 is the resistance (in ohms) of the first resistor 212, R3 is the resistance (in ohms) of the third resistor 216, and R6 is the resistance (in ohms) of the sixth resistor 224 that is initially determined based on power consumption and die area considerations.

$$m = \frac{R5 + 2*\left(\frac{R1*R3}{R1+R3}\right)}{R6} \tag{9}$$

In some examples, m can be determined utilizing Equation (9) above because from a small-signal analysis point of view (e.g., the point of view where the quiescent point of the voltage supervisor 200 is found and the non-linear elements of the voltage supervisor 200 are linearized at the quiescent point), the supply voltage is the same as ground. Therefore, the first resistor 212 (R1) and the third resistor 216 (R3) are in parallel, connecting the third voltage (V3) to the small signal ground. The small-signal current going through R1 and R3 in parallel is twice of the small-signal current in each R5 at the comparator toggling point. During design and configuration of the example voltage supervisor 200, the resistor values are selected to ensure that at the desired threshold voltage, $V_{dd\_th}$ is not affected from a variation in temperature. Based on the above information and the above Equations (6), (7), (8) and (9), the supply threshold voltage ($V_{dd\_th}$) can be determined. For example, $V_{dd\_th}$ can be determined utilizing Equation (10) below.

$$V_{dd\_th} = \left[\frac{\Delta V_{be}}{R6} * \left(R5 + 2 * \frac{R1 * R3}{R1 + R3}\right) + V_{be1}\right] * \left(1 + \frac{R1}{R3}\right) \quad (10)$$

In some examples, the supply threshold voltage ($V_{dd\_th}$) can be simplified. For example, the supply threshold voltage ($V_{dd\_th}$) can be simplified to the bandgap voltage ($V_{BG}$) times the ratio (r), as illustrated above in Equation 6.

In FIG. 2, the example scaling circuit 202 enables the detection of two threshold voltages ($V_{dd\_th}$), where both threshold voltages are up-scaled bandgap voltages and, thus, temperature insensitive. The following description of the example scaling circuit 202 includes all electrical components making up the scaling circuit 202, including the first switch 204, the second switch 206, the second resistor 214, and the fourth resistor 218.

The example scaling circuit 202 configures a falling threshold voltage and a rising threshold voltage. In some examples, the falling threshold voltage is less than the rising threshold voltage. For example, the comparator 226 toggles (e.g., changes a comparator output state) when the supply voltage rises to 3.04 volts and toggles when the supply voltage falls to 2.13 volts. Such a difference in toggling points ($\Delta V_{dd\_th}$) is indicative of an amount of hysteresis implemented and configured by the scaling circuit 202. The difference in toggling points (e.g., the difference in rising and falling threshold voltages, $\Delta V_{dd\_th}$) includes a range of voltage values at which the comparator 226 will not toggle (e.g., change comparator output state). For example, any level of supply voltage between 2.13 volts and 3.04 volts will not cause the comparator 226 to toggle.

In some examples, the rising supply threshold and the falling supply threshold are determined based on the amount of desired hysteresis. For example, a manufacture may desire a 10% hysteresis between the rising and falling threshold voltages, a 100 millivolt hysteresis, etc. In some examples, the rising supply threshold and falling supply threshold are determined when the desired hysteresis is selected. For example, the 10% threshold hysteresis is selected and 10% of the threshold voltage ($V_{dd\_th}$) is added to threshold voltage ($V_{dd\_th}$) for the rising threshold voltage. In this manner, the rising threshold voltage is 10% greater than the falling threshold voltage ($V_{dd\_th}$). In such an example, the falling threshold voltage is just equivalent to $V_{dd\_th}$.

Figure 3:
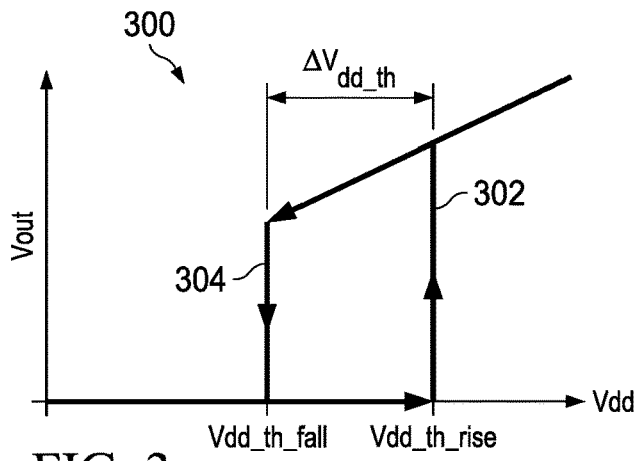
FIG. 3 is an example plot depicting hysteresis implemented by the scaling circuit of FIG. 2.

Turning to FIG. 3, an example plot 300 is illustrated to depict the hysteresis $\Delta V_{dd\_th}$. The example plot 300 includes an example rising supply threshold line 302 ($V_{dd\_th\_rise}$) and an example falling supply threshold line ($V_{dd\_th\_fall}$) 304. In some examples, the rising supply threshold line ($V_{dd\_th\_rise}$) 302 is the threshold voltage for rising supply voltage ($V_{dd}$) set by the scaling circuit 202 of FIG. 2. In some examples, the falling supply threshold line 304 is the threshold voltage for falling supply voltage ($V_{dd}$) set by the scaling circuit 202 of FIG. 2. In the plot 300, the x-axis represents the supply voltage $V_{dd}$ at the first node 101 and the y-axis represents the output of the logic gate 228.

In an example operation of the voltage supervisor 200, as the supply voltage ($V_{dd}$) increases, the output of the logic gate 228 stays low as depicted in plot 300. In some examples, when the supply voltage $V_{dd}$ meets the rising supply voltage ($V_{dd\_th\_rise}$), the output of the logic gate 228 goes high as depicted by the rising supply threshold line ($V_{dd\_th\_rise}$) 302. In some examples, the supply voltage $V_{dd}$ begins to decrease as depicted in plot 300. When the supply voltage $V_{dd}$ meets the falling threshold voltage ($V_{dd\_th\_fall}$), the output of the logic gate 228 goes low as depicted by the falling supply threshold voltage line ($V_{dd\_th\_fall}$) 304. The difference between the rising supply threshold voltage 302 and falling supply threshold voltage 304 is the hysteresis ($\Delta V_{dd\_th}$).

Turning back to FIG. 2, the example voltage supervisor 200 implements hysteresis utilizing a feedback loop. For example, the output of the comparator 226 is fed back to the scaling circuit 202 and received by the gate terminal of the first switch 204 and the gate terminal of the second switch 206. The feedback loop turns the first switch 204 and the second switch 206 on and off based on the output of the comparator 226. The first switch 204 and the second switch 206 are not on at the same time due to the different channel types (e.g., P-channel and N-channel) of the switches. For example, when the comparator output state at the output 234 is a high state, the first switch 204, implemented by a P-channel MOSFET, is off because of the positive voltage being applied to the gate terminal. Additionally, when the output 234 is high, the second switch 206, implemented by an N-channel MOSFET, is on due to the positive voltage applied to the gate terminal. In some examples, when the comparator output state at the output 234 is a low state, the second switch 206 is off due to the zero $V_{gs}$ applied to the gate and source terminals and the first switch 204 is on due to the negative $V_{gs}$ applied to the gate and source terminals.

In the example operation of the voltage supervisor 200, when the supply voltage $V_{dd}$ is low and increasing, the comparator output state at the output 234 is as high as the supply voltage. As such, the first switch 204 turns off (e.g., the first switch 204 is deactivated) and the second switch 206 turns on (e.g., the second switch 206 is initiated) as long as the supply voltage is above the threshold of second switch (M2) 206. In some examples, the fourth resistor 218 is shorted responsive to the second switch 206 turning on. For example, the fourth resistor 218 does not drop a voltage. In some examples, the resistance of the second resistor 214 is added to the resistance of the first resistor 212 responsive to the first switch 204 being turned off and, therefore, open. For example, the total resistance of an upper branch of the scaling circuit 202 (e.g., the first switch 204, the first resistor 212, and the second resistor 214) is the resistance of the first resistor 212 plus the resistance of the second resistor 214. In response to the first switch 204 being off and the second switch 206 being on, the total resistance of the lower branch of the scaling circuit 202 (e.g., the second switch 206, the third resistor 216, and the fourth resistor 218) is the resistance of the third resistor 216 only.

In some examples, when the comparator 226 output node 234 is high, the total resistance of the lower branch of the scaling circuit 202 is the resistance of the R3 216, and the total resistance of the upper branch of the scaling circuit 202 is the resistance of R1 212 plus the resistance of R2 214, the voltage ratio (r) is higher relative to when the total resistance of the lower branch including resistances of both R3 216 and R4 218 and the upper branch including only the resistance of the R1 212. For example, the voltage ratio (r) is determined based on the total resistance of the upper branch over the total resistance of the lower branch. In some examples, this voltage ratio (r) sets the rising threshold voltage. Therefore, the rising threshold voltage is set responsive to the first switch 204 opening (e.g., turned off) and the second switch 206 turning on. In some examples, when the first switch 204 is open and the second switch 206 is on, the voltage ratio ($r_{rise}$) for the rising supply threshold ($V_{dd\_th\_rise}$) can be determined utilizing Equation (11) below. In Equation (11) below, R1 is the resistance (in ohms) of the first resistor 212, R2 is the resistance (in ohms) of the second resistor 214, and R3 is the resistance (in ohms) of the third resistor 216.

$$r_{rise} = \frac{V_{dd\_th\_rise}}{V_{BG}} = 1 + \frac{R1 + R2}{R3} \quad (11)$$

In the example operation of the voltage supervisor 200, when the comparator 226 output node 234 is low, the first switch 204 turns on (e.g., the first switch 204 is initiated) and the second switch 206 turns off (e.g., the second switch 206 is deactivated). For example, the $V_{gs}$ on the P-channel MOSFET 204 becomes more negative, turning it on and the $V_{gs}$ of the N-channel MOSFET 206 also becomes zero, turning it off. In some examples, the second resistor 214 is shorted responsive to the first switch 204 turning on. For example, the second resistor 214 does not drop a voltage. Therefore, the total resistance of the upper branch (e.g., the numerator of the voltage ratio) is just the resistance of the first resistor 212. In some examples, the resistance of the fourth resistor 218 is added to the resistance of the third resistor 216 to equal the total resistance of the lower branch (e.g., the denominator of the voltage ratio) responsive to the second switch 206 being turned off. For example, the total resistance of the lower branch of the scaling circuit 202 is the resistance of the third resistor 216 plus the resistance of the fourth resistor 218.

In some examples, when the numerator of the voltage ratio is the resistance of the R1 212 and the denominator of the voltage ratio is the resistance of R3 216 plus the resistance of R4 218, the falling supply threshold ($V_{dd\_th\_fall}$) is set. For example, the voltage ratio ($r_{fall}$) is lower relative to the voltage ratio ($r_{rise}$) of Equation (11) above, thus setting a lower threshold voltage than the threshold voltage set by the voltage ratio ($r_{rise}$) of Equation (11) above. Therefore, the falling threshold voltage ($V_{dd\_th\_fall}$) is set responsive to the first switch 204 turning on and the second switch 206 turning off. In some examples, when the first switch 204 is on and the second switch 206 is off (e.g., open), the voltage ratio ($r_{fall}$) for the falling supply threshold ($V_{dd\_th\_fall}$) can be determined utilizing Equation 12 below. In Equation (12) below, R1 is the resistance (in ohms) of the first resistor 212, R3 is the resistance (in ohms) of the third resistor 216, and R4 is the resistance (in ohms) of the fourth resistor 218.

$$r_{fall} = \frac{V_{dd\_th\_fall}}{V_{BG}} = 1 + \frac{R1}{R3 + R4} \quad (12)$$

In such examples shown by Equations (11) and (12) above, to meet the requirements of the rising threshold voltage ($V_{dd\_th\_rise}$) and the falling threshold voltage ($V_{dd\_th\_fall}$), the resistance values of the upper branch and the lower branch are to change based on which threshold voltage is to be detected. For example, if the rising threshold voltage ($V_{dd\_th\_rise}$) is to be detected, the resistance of the upper branch increases due to the addition of the second resistor 214 and the resistance of the lower branch decreases due to the subtraction from the fourth resistor 218. Alternatively, if the falling threshold voltage ($V_{dd\_th\_fall}$) is to be detected, the resistance of the lower branch increases due to the addition of the fourth resistor 218 and the resistance of the upper branch decreases due to the shorting of the second resistor 214. Therefore, the resistance values of the second resistor 214 and the fourth resistor 218 are to be carefully selected to ensure the rising and falling threshold voltages are correctly set.

In some examples, the resistance values of R2 214 and R4 218 are determined based on two factors: one is that the values are to enable (e.g., configure, equal, etc.) the desired hysteresis $\Delta V_{dd\_th}$, the second is the idea that the value of m, determined by Equation 9 above, cannot change. Turning to the second factor used for selecting the resistance values of R2 214 and R4 218, m is the value that is set in order to ensure the threshold voltage is temperature insensitive. Therefore, the total resistance of upper branch and lower branch in parallel must remain the same in order to keep m unchanged when determining resistance values for R2 214 and R4 218. In examples disclosed herein, for a rising supply voltage, the total upper branch resistance is the combination of the resistance of R1 212 and the resistance of R2 214. In examples disclosed herein, for a falling supply voltage, the total lower branch resistance is the combination of the resistance of R3 216 and the resistance of R4 218.

In some examples, due to the nature of the scaling circuit 202, the second resistor (R2) 214 and the fourth resistor (R4) 218 are not used at the same time. For example, when the supply voltage is rising, the total resistance in parallel of the scaling circuit 202 includes the first resistor (R1) 212, the second resistor (R2) 214, and the third resistor (R3) 216. In other examples, when the supply voltage is falling, the total resistance in parallel of the scaling circuit 202 includes the first resistor (R1) 212, the third resistor (R3) 216, and the fourth resistor (R4) 218. Therefore, to ensure that the total resistance in parallel of the scaling circuit 202 is kept constant when the supply voltage is rising and when the supply voltage is falling is determined utilizing Equation (13) below.

$$\frac{R1 * (R3 + R4)}{R1 + (R3 + R4)} = \frac{(R1 + R2) * R3}{(R1 + R2) + R3} \quad (13)$$

By utilizing Equation (13) above, the resistance of the second resistor 214 (R2) and the resistance of the fourth resistor 218 (R4) can be derived. However, the first factor used for selecting the resistance values of R2 214 and R4 218 is to be taken into consideration. For example, the desired hysteresis $\Delta V_{dd\_th}$ is used to determine how much change in voltage ratio ($\Delta r$) is needed and, thus, how much resistance should be on R2 214 and R4 218. The change in voltage ratio ($\Delta r$), as illustrated in Equation (14) below, is directly proportional to the hysteresis ($\Delta V_{dd\_th}$), where the greater the change in $\Delta r$, the greater the hysteresis. The change in voltage ratio is the ratio applied to up-scale the bandgap voltage for rising threshold voltage to the ratio applied to up-scale the bandgap voltage for falling threshold voltage. In some examples, to keep m unchanged, R2 214 is linearly related to the change in voltage ratio ($\Delta r$), R2 214 increases linearly. Additionally, R4 218 is nonlinearly related to the change in voltage ratio ($\Delta r$). In some examples, Equation (15) and Equation (16) can be used to systematically select the resistance values of R2 214 and R4 218. In Equation (15), $\Delta r$ is the change in voltage ratio, and r is the voltage ratio related to the falling threshold (i.e., $r=r_{fall}$).

$$\Delta r = r_{rise} - r_{fall} = \frac{V_{dd\_th\_rise} - V_{dd\_th\_fall}}{V_{BG}} = \frac{\Delta V_{dd\_th}}{V_{BG}} \quad (14)$$

$$\frac{R4}{R3 + R4} = \frac{\Delta r}{r*(r-1+\Delta r)} \quad (15)$$

$$\frac{R2}{R1} = \frac{\Delta r}{\gamma} \quad (16)$$

Equation (15) above corresponds to the relationship between the resistance of the third and fourth resistors 216, 218 and the voltage ratios for the rising and falling threshold voltages. Equation (16) above corresponds to the relationship between the resistance of the first and second resistors 212, 214 and the voltage ratios for the rising and falling threshold voltage. The scaling circuit 202 improves the efficiency of designing a voltage supervisor 200 because resistor values can be determined with a simple calculation rather than a plug-and-chug guessing method. For example, a designer can utilize Equations (15) and (16) above to determine resistor values of the scaling circuit 202 rather than guessing values, testing them, then adjusting the values based on the testing results. The latter can take an inefficient amount of time. In some example embodiments, resistors 212, 214, 216 and 218 can be implemented using programmable resistor(s) (or variable resistors) that can be programmed/varied in operation or prior to operation by values stored in memory. In other example embodiments, resistors 212, 214, 216 and 218 may be external to the scaling circuit 202 and, thereby, determined after manufacturing of the scaling circuit 202.

The example voltage supervisor 200 is an improvement over conventional voltage supervisors because the scaling circuit 202 enables a rising threshold detection point and falling threshold detection point that are temperature insensitive, even above the bandgap voltage. The voltage supervisor 200 is an improvement over conventional voltage supervisors because the scaling circuit 202 configures hysteresis to ensure that no oscillation occurs at the output 234 of the comparator 226.

Figure 4:
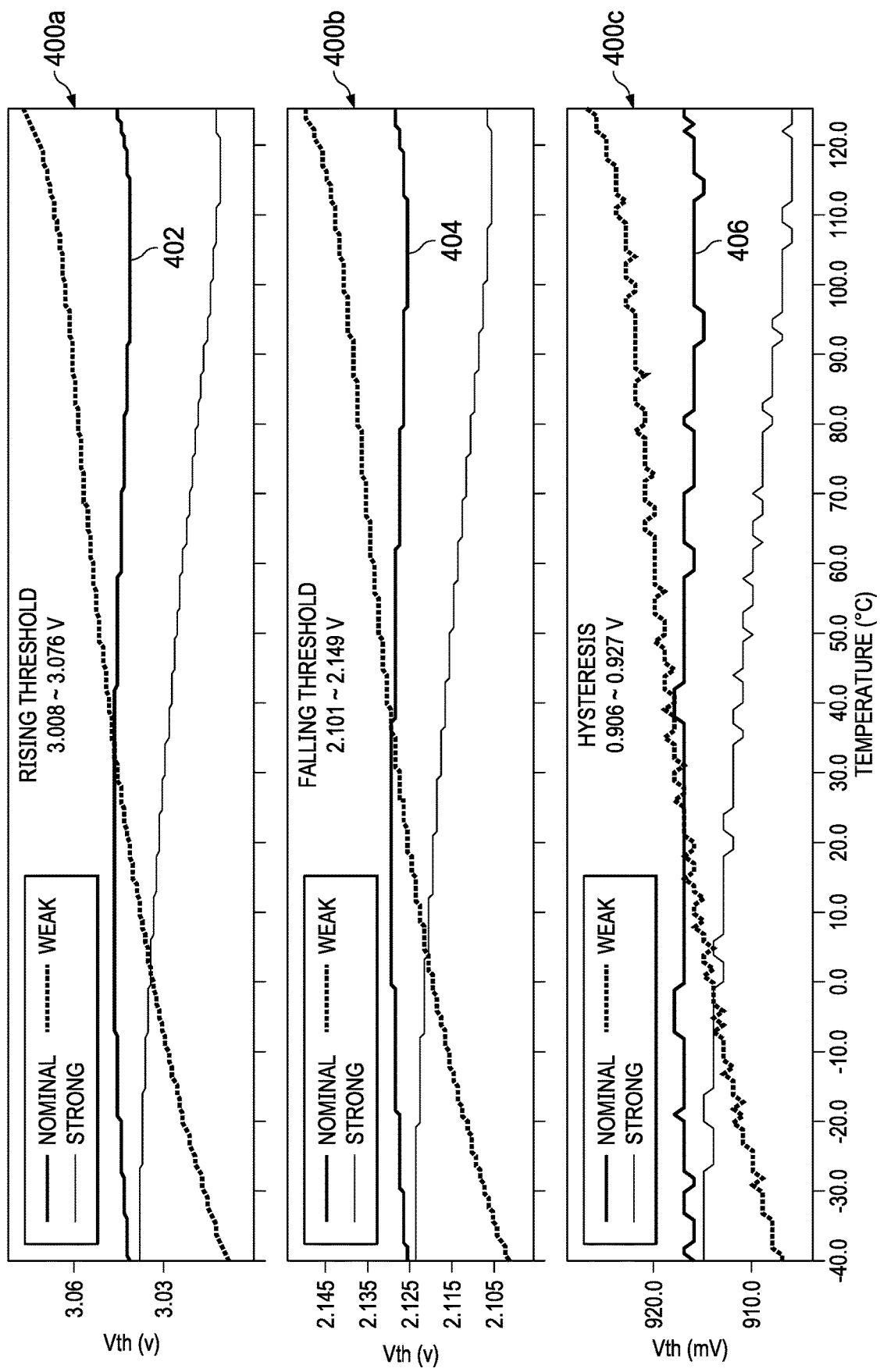
FIG. 4 illustrates a signal plot depicting threshold voltage variations versus system temperature of the voltage supervisor of FIG. 2.

FIG. 4 illustrates signal plots depicting threshold voltage variations (Vth) versus system temperature for the voltage supervisor 200 of FIG. 2. The signal plots of FIG. 4 include a first plot 400a corresponding to the rising threshold voltage variations versus system temperature. The signal plots of FIG. 4 include a second plot 400b corresponding to the falling threshold voltage variations versus system temperature. The signal plots of FIG. 4 include a third plot 400c corresponding to the voltage variations of the hysteresis versus system temperature.

The first plot 400a includes a first threshold voltage line 402, the second plot 400b includes a second threshold voltage line 404, and the third plot 400c includes a hysteresis line 406. In FIG. 4, the first threshold voltage line 402 may represent the signal (e.g., voltage) at the first node 101 of the voltage supervisor 200 of FIG. 2 when the supply voltage generator 102 outputs the rising threshold voltage. In FIG. 4, the second threshold voltage line 404 may represent the signal (e.g., voltage) at the first node 101 of the voltage supervisor 200 of FIG. 2 when the supply voltage generator 102 outputs the falling threshold voltage. In FIG. 4, the hysteresis line 406 may represent the amount voltage between the rising and falling threshold voltages of the voltage supervisor 200 of FIG. 2.

In FIG. 4, there are multiple first threshold voltage lines 402, multiple second threshold voltage lines 404, and multiple hysteresis lines 406, where one line (for each plot 400a, 400b, and 400c) is indicative of the ideal/nominal process conditions and the other lines represent process variations (such as "process corners"). As used herein, a process corner is an example of a design-of-experiments technique that looks at device performance based on device fabrication process deviations where each "corner" represents an extreme deviation in one or more process conditions. Process corners represent the extremes of these parameter variations within which a circuit (e.g., voltage supervisor 200) that has been formed on/over a semiconductor wafer must function correctly. A circuit (e.g., the voltage supervisor 200) running on devices fabricated at these process corners may run slower or faster than specified and at lower or higher temperatures and voltages. In FIG. 4, the ideal/nominal process condition of the voltage supervisor 200 is represented by the dotted line and is referred to as the first threshold voltage line 402, the second threshold voltage line 404, and the hysteresis line 406. In FIG. 4, a strong process condition of the voltage supervisor 200 is represented by the triangle lines. In FIG. 4, a weak process condition of the voltage supervisor 200 is represented by the dashed lines.

The example first plot 400a depicts a variation of rising threshold voltage as the temperature increases from −40° C. to 125° C. The example first threshold voltage line 402 ranges from about 3.036 volts to 3.04 volts for an ideal process condition. In some examples, the rising threshold voltage is configured at 3.04 volts. Therefore, the first plot 400a demonstrates that there is very little drift of voltage over an extreme range of temperatures with ideal process conditions for detection of rising threshold voltage.

The example second plot 400b depicts a variation of falling threshold voltage as the temperature increases from −40° C. to 125° C. The example second threshold voltage line 404 ranges from about 2.125 volts to 2.13 volts for an ideal process condition. In some examples, the falling threshold voltage is configured at 2.13 volts. Therefore, the second plot 400b demonstrates that there is very little drift of voltage over an extreme range of temperatures with ideal process conditions for detection of falling threshold voltage.

The example third plot 400c depicts a variation of hysteresis as the temperature increases from −40° C. to 125° C. The example hysteresis line 406 ranges from about 0.916 volts to 0.918 volts for an ideal process condition. In some examples, the amount of hysteresis is configured to be 0.915 volts. Therefore, the third plot 400c demonstrates that there is very little drift of hysteresis over an extreme range of temperatures with ideal process conditions.

Figure 5:
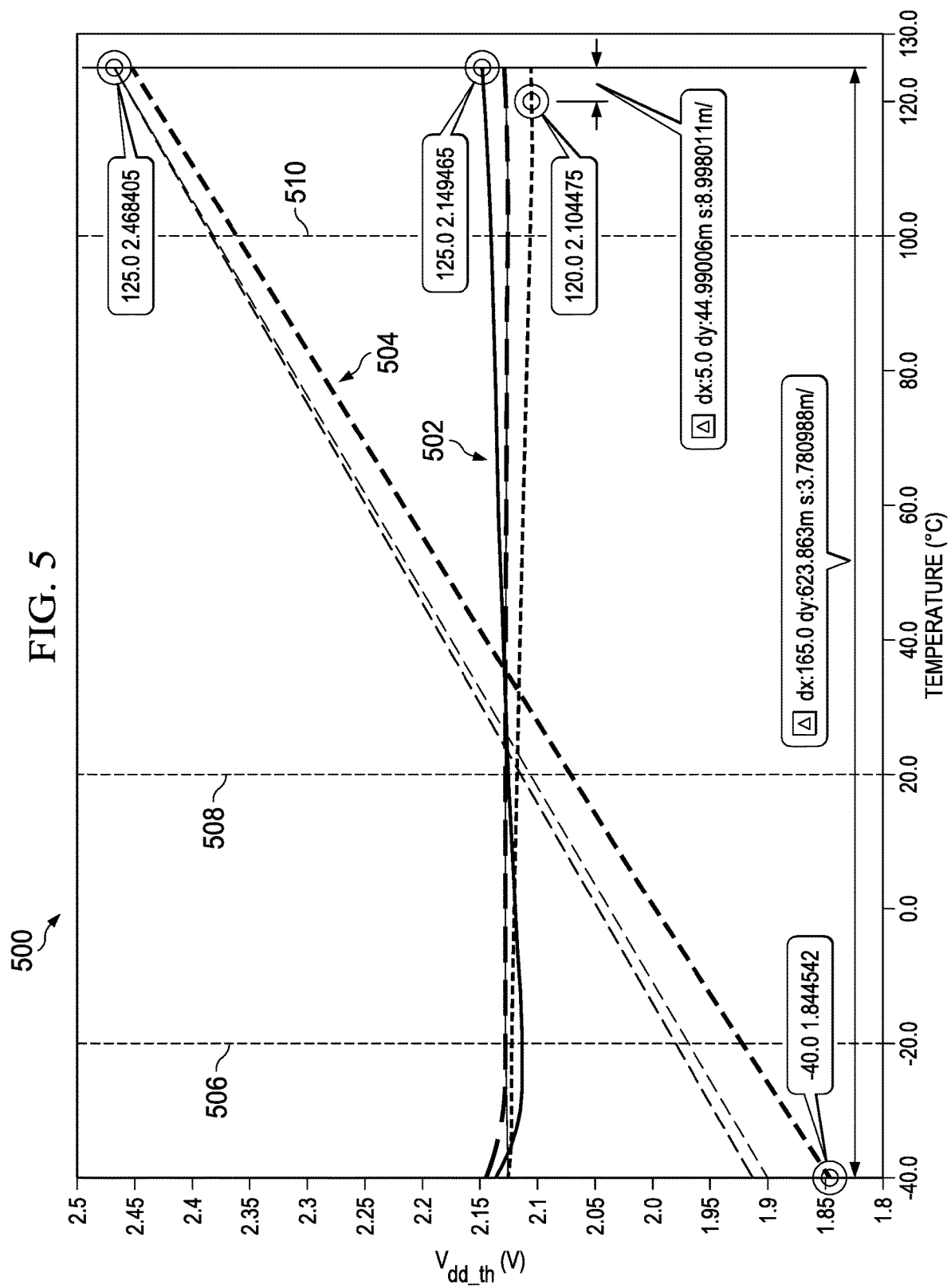
FIG. 5 illustrates a signal plot depicting differences between threshold voltage variation over temperature of the voltage supervisor of FIG. 2 and a voltage supervisor without the scaling circuit.

FIG. 5 illustrates a signal plot 500 depicting threshold voltage variations versus system temperature for voltage supervisors including the scaling circuit 202 and not including the scaling circuit 202. The signal plot 500 includes a first threshold voltage line 502 and a second threshold voltage line 504. In FIG. 5, the first threshold voltage line 502 may represent the signal (e.g., voltage) at the first node 101 of the voltage supervisor 200 of FIG. 2 when the supply voltage generator 102 outputs the threshold voltage ($V_{th}$). In FIG. 5, the second threshold voltage line 504 may represent the signal (e.g., voltage) of supply voltage of a conventional voltage supervisor without the scaling circuit 202 when a supply generator outputs a threshold voltage. In the signal plot 500 of FIG. 5, the threshold voltage is approximately 2.1 volts for a rising supply voltage (Vdd).

In FIG. 5, there are multiple first threshold voltage lines 502 and multiple second threshold voltage lines 504, where one line (first threshold voltage line 502 and second threshold voltage line 504) is indicative of the ideal/nominal process conditions and the other lines represents a process variations (such as "process corners").

In FIG. 5, the signal plot 500 includes a range of temperatures from −40° C. to 125° C. (horizontal axis) for the voltage supervisor (one set including the scaling circuit 202 and the other not including the scaling circuit 202). At a first temperature 506, the voltage supervisor 200 and the voltage supervisor without the scaling circuit 202 are subject to −20° C. (e.g., below the freezing point of water). At the first temperature 506, the first threshold voltage line 502 is indicative of approximately 2.13 volts. For example, the threshold voltage ($V_{dd\_th}$) of the voltage supervisor 200 is approximately 2.13 volts at −20° C. At the first temperature 506, the second threshold voltage line 504 is indicative of approximately 1.9 volts. For example, the threshold voltage ($V_{dd\_th}$) of the conventional voltage supervisor is approximately 1.9 volts at −20° C. There is a 230 millivolt difference at −20° C. between the voltage supervisor 200 and the conventional voltage supervisor without the scaling circuit 202.

At a second temperature 508, the voltage supervisor 200 and the conventional voltage supervisor without the scaling circuit 202 are subject to 20° C. (e.g., room temperature). At the second temperature 508, the first threshold voltage line 502 is indicative of approximately 2.13 volts. For example, at 20° C., the threshold voltage ($V_{dd\_th}$) of the voltage supervisor 200 is approximately 2.13 volts. At the second temperature 508, the second threshold voltage line 504 is indicative of approximately 2.1 volts. For example, at 20° C., the threshold voltage ($V_{dd\_th}$) of the voltage supervisor without the scaling circuit 202 is approximately 2.1 volts, indicating that the second temperature 508 is an ideal temperature, because it does not cause the devices of the voltage supervisor without the scaling circuit 202 to vary in input and output.

At third temperature 510 (100° C., e.g., boiling point of water), the threshold voltage ($V_{dd\_th}$) of the voltage supervisor 200 is approximately 2.13 volts, and the threshold voltage ($V_{dd\_th}$) of the conventional voltage supervisor (without the scaling circuit 202) is approximately 2.37 volts. There is a 240 millivolt difference between the threshold voltages of the voltage supervisor 200 and the conventional voltage supervisor without the scaling circuit 202.

Overall, with the temperature range of −40° C. to 125° C., the threshold voltage variation for conventional voltage supervisors without the scaling circuit 202 ranges from approximately 1.84 volts to 2.47 volts. Alternatively, over this same temperature range, the threshold voltage variation for the voltage supervisor 200 is between approximately 2.10 volts and 2.15 volts. Therefore, in examples disclosed herein, the threshold variation over process and temperature is reduced by a factor of approximately 10 (e.g., 630 millivolt variation reduced to 50 millivolt variation) for threshold voltages above the bandgap voltage.

Figure 6:
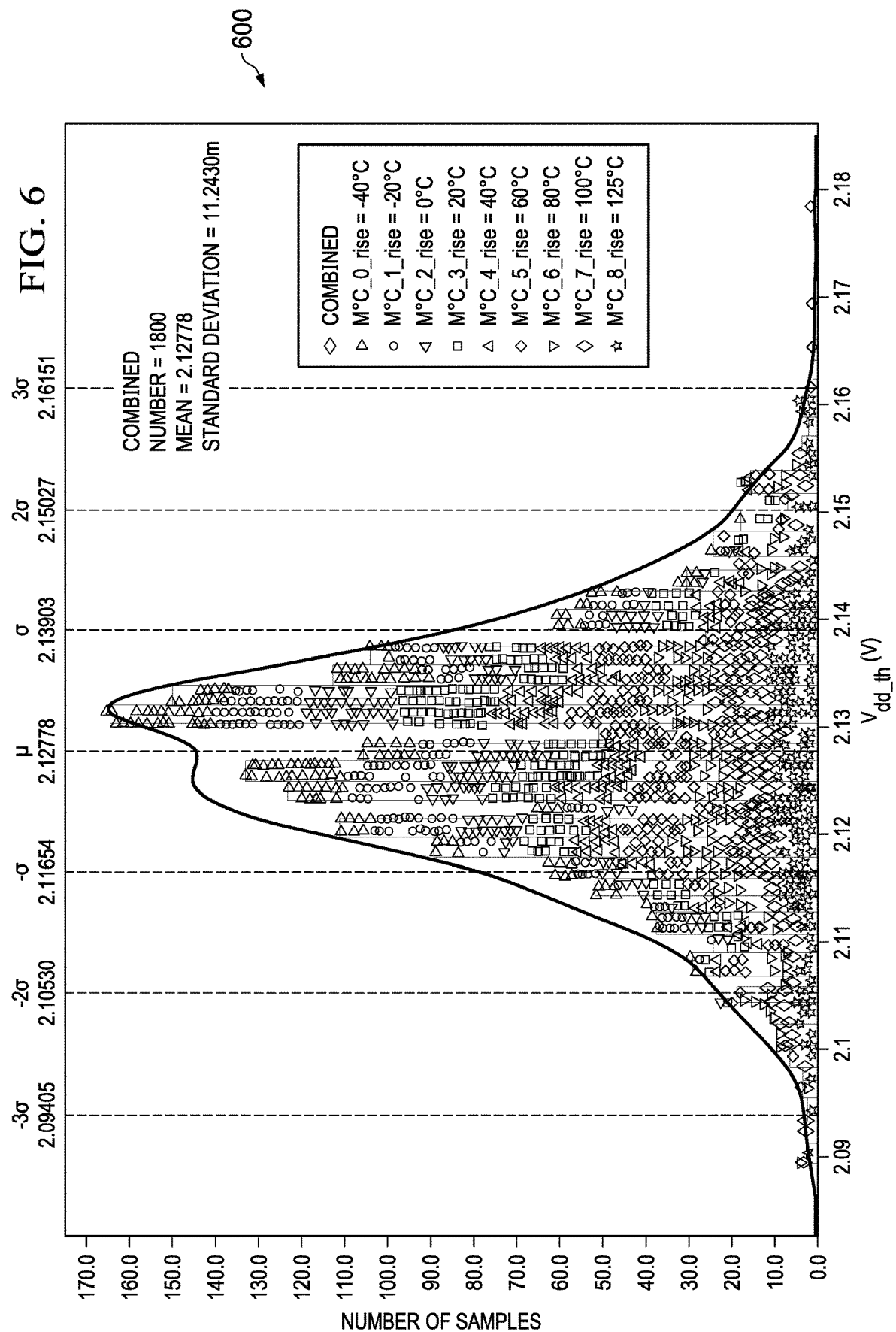
FIG. 6 illustrates a probability distribution graph depicting the threshold voltage of the voltage supervisor of FIG. 2 over nine different temperatures.

FIG. 6 illustrates a probability distribution graph 600 depicting the threshold voltage of the voltage supervisor 200 over nine different temperatures. In FIG. 6, the probability distribution graph 600 is a Monte-Carlo simulation, where the voltage supervisor 200 is sampled multiple times with random process variables. For example, the Monte-Carlo simulation randomly varies the fabrication processes of the components in the voltage supervisor 200, runs 200 Monte-Carlo simulations at each temperature point, then distributes the threshold voltage of the simulation on the probability distribution graph 600. The voltage supervisor 200 utilized during the simulations was configured to toggle at 2.13 volts without hysteresis. As such, the threshold voltage ($V_{dd\_th}$) is configured to equal 2.13 volts.

In FIG. 6, the Monte-Carlo simulation runs at nine different temperatures and 200 simulations per temperature. In FIG. 6, the probability distribution graph 600 illustrates the threshold voltage ($V_{dd\_th}$) of a first simulation temperature MC_0_rise=−40° C., the threshold voltage ($V_{dd\_th}$) of a second simulation temperature MC_1_rise=−20° C., the threshold voltage ($V_{dd\_th}$) of a third simulation temperature MC_2_rise=0° C., the threshold voltage ($V_{dd\_th}$) of a fourth simulation temperature MC_3_rise=20° C., the threshold voltage ($V_{dd\_th}$) of a fifth simulation temperature MC_4_rise=40° C., the threshold voltage ($V_{dd\_th}$) of a sixth simulation temperature MC_5_rise=60° C., the threshold voltage ($V_{dd\_th}$) of a seventh simulation temperature MC_6_rise=80° C., the threshold voltage ($V_{dd\_th}$) of an eighth simulation temperature MC_7_rise=100° C., and the threshold voltage ($V_{dd\_th}$) of a ninth simulation temperature MC_8_rise=125° C.

Based on the results of all nine simulation temperatures, the threshold voltage ($V_{dd\_th}$) of the voltage supervisor 200 had a mean (e.g., average) of approximately 2.128 volts and a standard deviation of approximately 11.2 millivolts over 1800 simulations. In some examples, such a standard deviation is small relative to the amount of mismatch between components randomly configured with different device parameters over the simulations.

Example methods, apparatus, systems, and articles of manufacture to implement temperature insensitive threshold detection for voltage supervisors are disclosed herein. Further examples and combinations thereof include the following:

Example 1 includes an apparatus comprising a first switch having a first source terminal, a first drain terminal, and a first gate terminal, a first resistor having a first resistor terminal and a second resistor terminal, the first resistor terminal coupled to the first source terminal and second resistor terminal coupled to the first drain terminal, a second resistor having a third resistor terminal and a fourth resistor terminal, the third resistor terminal coupled to the second resistor terminal, a third resistor having a fifth resistor terminal and a sixth resistor terminal, the fifth resistor terminal coupled to the fourth resistor terminal, a fourth resistor having a seventh resistor terminal and an eighth resistor terminal, the seventh resistor terminal coupled to the sixth resistor terminal, a second switch having a second source terminal, a second drain terminal, and a second gate terminal, the second source terminal coupled to the seventh resistor terminal, and a comparator having an output, the output coupled to the first gate terminal and the second gate terminal.

Example 2 includes the apparatus of example 1, wherein the first switch comprises a P-channel metal-oxide-semiconductor field-effect transistor (MOSFET) and the second switch comprises an N-channel MOSFET.

Example 3 includes the apparatus of example 1, wherein the comparator includes a first input and a second input, the apparatus further including a fifth resistor having a ninth resistor terminal and a tenth resistor terminal, the ninth resistor terminal coupled to the fourth resistor terminal and the fifth resistor terminal at a first node, the tenth resistor terminal coupled to the second input, and a sixth resistor having an eleventh resistor terminal and a twelfth resistor terminal, the eleventh resistor terminal coupled to the ninth resistor terminal, the fourth resistor terminal, and the fifth resistor terminal, the twelfth resistor terminal coupled to the first input.

Example 4 includes the apparatus of example 3, wherein the fifth resistor and the sixth resistor comprise substantially equal resistance values.

Example 5 includes the apparatus of example 1, wherein the first source terminal is configured to be coupled to a supply voltage generator.

Example 6 includes the apparatus of example 1, wherein the comparator includes a first input and a second input, the apparatus further including a first transistor having a first current terminal, a second current terminal, and a first control terminal, the first current terminal coupled to the second input and the first control terminal coupled to the first current terminal at a first node, and a second transistor having a third current terminal, a fourth current terminal, and a second control terminal, the third current terminal coupled to the first input and the second control terminal coupled to the first control terminal.

Example 7 includes the apparatus of example 6, wherein the first transistor and the second transistor comprise NPN bipolar junction transistors (BJTs).

Example 8 includes the apparatus of example 6, further including a fifth resistor having a ninth resistor terminal, the ninth resistor terminal coupled to the fourth current terminal.

Example 9 includes the apparatus of example 1, further including a logic gate having a logic gate input and a logic gate output, the logic gate input coupled to the output of the comparator.

Example 10 includes the apparatus of example 9, wherein the logic gate comprises an inverter.

Example 11 includes the apparatus of example 1, wherein the comparator includes a first input and a second input, the apparatus further including a fifth resistor having a ninth resistor terminal and a tenth resistor terminal, the ninth resistor terminal coupled to the fourth resistor terminal and the fifth resistor terminal at a first node, the tenth resistor terminal coupled to the second input, a sixth resistor having an eleventh resistor terminal and a twelfth resistor terminal, the eleventh resistor terminal coupled to the ninth resistor terminal, the fourth resistor terminal, and the fifth resistor terminal, the twelfth resistor terminal coupled to the first input, a first transistor having a first current terminal, a second current terminal, and a first control terminal, the first current terminal coupled to the second input, the tenth resistor terminal, and the first control terminal at the first node, a second transistor having a third current terminal, a fourth current terminal, and a second control terminal, the third current terminal coupled to the first input and the twelfth resistor terminal, and the second control terminal coupled to the first control terminal, and a seventh resistor having a thirteenth resistor terminal coupled to the fourth current terminal.

Example 12 includes a system comprising a voltage supervisor including a scaling circuit having a first input terminal and a first output terminal, the first input terminal configured to be coupled to a supply voltage, the scaling circuit configured to generate a first threshold voltage and a second threshold voltage, and a comparison circuit having a second input terminal, a third input terminal, and a second output terminal, the second input terminal configured to be coupled to the supply voltage, the third input terminal coupled to the first output terminal, the comparison circuit configured to toggle the second output terminal at the first threshold voltage and at the second threshold voltage, and a circuit block including a circuit block input terminal coupled to the second output terminal, the circuit block to operate at the first threshold voltage, wherein the first threshold voltage is greater than a bandgap voltage.

Example 13 includes the system of example 12, wherein the voltage supervisor further includes a first switch having a first source terminal, a first drain terminal, and a first gate terminal, a first resistor having a first resistor terminal and a second resistor terminal coupled between the first source terminal and the first drain terminal, a second resistor having a third resistor terminal and a fourth resistor terminal, the third resistor terminal coupled to the second resistor terminal, a third resistor having a fifth resistor terminal and a sixth resistor terminal, the fifth resistor terminal coupled to the fourth resistor terminal, a fourth resistor having a seventh resistor terminal and an eighth resistor terminal, the seventh resistor terminal coupled to the sixth resistor terminal, a second switch having a second source terminal, a second drain terminal, and a second gate terminal, the second source terminal coupled to the seventh resistor terminal, and a comparator having an output, the output coupled to the first gate terminal and the second gate terminal.

Example 14 includes the system of example 13, wherein the first switch comprises a P-channel metal-oxide-semiconductor field-effect transistor (MOSFET) and the second switch comprises an N-channel MOSFET.

Example 15 includes the system of example 13, wherein the comparator includes a negative input and a positive input, the voltage supervisor further including a fifth resistor having a ninth resistor terminal and a tenth resistor terminal, the ninth resistor terminal coupled to the fourth resistor terminal and the fifth resistor terminal at a first node, the tenth resistor terminal coupled to the positive input, and a sixth resistor having an eleventh resistor terminal and a twelfth resistor terminal, the eleventh resistor terminal coupled to the ninth resistor terminal, the fourth resistor terminal, and the fifth resistor terminal, the twelfth resistor terminal coupled to the negative input.

Example 16 includes the system of example 12, further including the scaling circuit comprising a first switch having a first source terminal, a first drain terminal, and a first gate terminal, a first resistor having a first resistor terminal and a second resistor terminal coupled between the first source terminal and the first drain terminal, a second resistor having a third resistor terminal and a fourth resistor terminal, the third resistor terminal coupled to the second resistor terminal, a third resistor having a fifth resistor terminal and a sixth resistor terminal, the fifth resistor terminal coupled to the fourth resistor terminal, a fourth resistor having a seventh resistor terminal and an eighth resistor terminal, the seventh resistor terminal coupled to the sixth resistor terminal, and a second switch having a second source terminal, a second drain terminal, and a second gate terminal, the second source terminal coupled to the seventh resistor terminal, and the comparison circuit comprising a comparator having a first input, a second input, and an output, the output coupled to the first gate terminal and the second gate terminal, a fifth resistor having a ninth resistor terminal and a tenth resistor terminal, the ninth resistor terminal coupled to the fourth resistor terminal and the fifth resistor terminal at a first node, the tenth resistor terminal coupled to the second input, a sixth resistor having an eleventh resistor terminal and a twelfth resistor terminal, the eleventh resistor terminal coupled to the ninth resistor terminal, the fourth resistor terminal, and the fifth resistor terminal, the twelfth resistor terminal coupled to the first input, a first transistor having a first current terminal, a second current terminal, and a first control terminal, the first current terminal coupled to the second input, the tenth resistor terminal, and the first control terminal at the first node, a second transistor having a third current terminal, a fourth current terminal, and a second control terminal, the third current terminal coupled to the first input and the twelfth resistor terminal, and the second control terminal coupled to the first control terminal, a seventh resistor having a thirteenth resistor terminal coupled to the fourth current terminal, and a logic gate having a logic gate input and a logic gate output, the logic gate input coupled to the output of the comparator.

Example 17 includes the system of example 12, wherein the circuit block is an analog block or a digital block.

Example 18 includes a method comprising initiating a first switch and deactivating a second switch responsive to a comparator output state going high, the comparator output state connected to a control terminal of the first switch and a control terminal of the second switch, generating a first voltage ratio and a first voltage corresponding to the first voltage ratio across a first resistor responsive to the first switch initiating and the second switch deactivating, in response to a supply voltage equaling a first threshold voltage, the first threshold voltage greater than a bandgap voltage generating a second voltage across a second resistor that is equal to or proportional to the first voltage across the first resistor, comparing the first voltage and the second voltage, toggling the comparator output state responsive to the comparison of the first voltage and the second voltage, and deactivating the first switch and initiating the second switch to generate a second voltage ratio and a second threshold voltage responsive to the toggling of the comparator output state.

Example 19 includes the method of example 18, wherein the first voltage and the second voltage are equal at the first threshold voltage, the first threshold voltage insensitive to temperature variation, the method further including generating a third voltage across the first resistor corresponding to the second voltage ratio, in response to the supply voltage equaling the second threshold voltage, generating a fourth voltage across the second resistor that is equal to or proportional to the third voltage across the first resistor, comparing the third voltage to the fourth voltage, the third voltage and fourth voltage to be equal at the second threshold voltage, the second threshold voltage insensitive to temperature variation, and toggling the comparator output state responsive to the comparison of the third voltage to the fourth voltage.

Example 20 includes the method of example 18, further including generating hysteresis between the first threshold voltage and the second threshold voltage, the hysteresis based on the first voltage ratio and the second voltage ratio generated from the first switch and second switch and a plurality of resistors connected to the first switch and second switch, the hysteresis to be insensitive to temperature variation.

From the foregoing, it will be appreciated that example methods, apparatus and articles of manufacture have been disclosed that generate temperature insensitive threshold voltages for voltage supervisors that operate using threshold voltages above the bandgap voltage. Examples disclosed herein include a scaling circuit that up-scales the bandgap voltage when the supply voltage is equal to the desired threshold voltages. Examples disclosed herein implement hysteresis to avoid oscillation at the output of the comparator when the rising supply voltage and the falling supply voltage are near the desired threshold voltage. Examples disclosed herein configure the hysteresis to be insensitive to temperature variation and, thus, improve operation of the voltage supervisor when monitoring supply voltage.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third-party.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While particular transistor structures are referred to above, other transistors or device structures may be used instead. For example, p-type MOSFETs may be used in place of n-type MOSFETs with little or no additional changes. In addition, other types of transistors (such as bipolar transistors) may be utilized in place of the transistors shown.

As used herein, the terms "terminal", "node", "interconnection", "lead" and "pin" are used interchangeably. Unless specifically stated to the contrary, these terms are generally used to mean an interconnection between or a terminus of a device element, a circuit element, an integrated circuit, a device or other electronics or semiconductor component.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent. The following claims are hereby incorporated into this Detailed Description by this reference, with each claim standing on its own as a separate embodiment of the present disclosure.

What is claimed is:

1. An apparatus comprising:
   a first switch having a first current terminal, a second current terminal, and a first control terminal;
   a first resistor having a first resistor terminal and a second resistor terminal, the first resistor terminal coupled to the first current terminal and the second resistor terminal coupled to the second current terminal;
   a second resistor having a third resistor terminal and a fourth resistor terminal, the third resistor terminal coupled to the second resistor terminal;
   a third resistor having a fifth resistor terminal and a sixth resistor terminal, the fifth resistor terminal coupled to the fourth resistor terminal;
   a fourth resistor having a seventh resistor terminal and an eighth resistor terminal, the seventh resistor terminal coupled to the sixth resistor terminal;
   a second switch having a third current terminal, a fourth current terminal, and a second control terminal, the third current terminal coupled to the seventh resistor terminal; and
   a comparator having an output, the output coupled to the first control terminal and the second control terminal.

2. The apparatus of claim 1, wherein the first switch comprises a P-channel metal-oxide-semiconductor field-effect transistor (MOSFET) and the second switch comprises an N-channel MOSFET.

3. The apparatus of claim 1, wherein the comparator includes a first input and a second input, the apparatus further including:
   a fifth resistor having a ninth resistor terminal and a tenth resistor terminal, the ninth resistor terminal coupled to the fourth resistor terminal and the fifth resistor terminal at a first node, the tenth resistor terminal coupled to the second input; and
   a sixth resistor having an eleventh resistor terminal and a twelfth resistor terminal, the eleventh resistor terminal coupled to the ninth resistor terminal, the fourth resistor terminal, and the fifth resistor terminal, the twelfth resistor terminal coupled to the first input.

4. The apparatus of claim 3, wherein the fifth resistor and the sixth resistor comprise substantially equal resistance values.

5. The apparatus of claim 1, wherein the first current terminal is configured to be coupled to a supply voltage generator.

6. The apparatus of claim 1, wherein the comparator includes a first input and a second input, the apparatus further including:
   a first transistor having a fifth current terminal, a sixth current terminal, and a third control terminal, the fifth current terminal coupled to the second input and the third control terminal coupled to the fifth current terminal at a first node; and
   a second transistor having a seventh current terminal, an eighth current terminal, and a fourth control terminal, the seventh current terminal coupled to the first input and the fourth control terminal coupled to the third control terminal.

7. The apparatus of claim 6, wherein the first transistor and the second transistor comprise NPN bipolar junction transistors (BJTs).

8. The apparatus of claim 6, further including a fifth resistor having a ninth resistor terminal, the ninth resistor terminal coupled to the fourth current terminal.

9. The apparatus of claim 1, further including a logic gate having a logic gate input and a logic gate output, the logic gate input coupled to the output of the comparator.

10. The apparatus of claim 9, wherein the logic gate comprises an inverter.

11. The apparatus of claim 1, wherein the comparator includes a first input and a second input, the apparatus further including:
    a fifth resistor having a ninth resistor terminal and a tenth resistor terminal, the ninth resistor terminal coupled to the fourth resistor terminal and the fifth resistor terminal at a first node, the tenth resistor terminal coupled to the second input;
    a sixth resistor having an eleventh resistor terminal and a twelfth resistor terminal, the eleventh resistor terminal coupled to the ninth resistor terminal, the fourth resistor terminal, and the fifth resistor terminal, the twelfth resistor terminal coupled to the first input;
    a first transistor having a fifth current terminal, a sixth current terminal, and a third control terminal, the fifth current terminal coupled to the second input, the tenth resistor terminal, and the third control terminal at the first node;
    a second transistor having a seventh current terminal, an eighth current terminal, and a fourth control terminal, the seventh current terminal coupled to the first input and the twelfth resistor terminal, and the fourth control terminal coupled to the third control terminal; and
    a seventh resistor having a thirteenth resistor terminal coupled to the fourth current terminal.

12. A voltage supervisor having a first threshold voltage output, the voltage supervisor including:
    a scaling circuit having a first input terminal and a first output terminal, the first input terminal configured to be coupled to a supply voltage, the scaling circuit configured to generate a first threshold voltage and a second threshold voltage; and
    a comparison circuit having a second input terminal, a third input terminal, and a second output terminal, the second input terminal configured to be coupled to the supply voltage, the third input terminal coupled to the first output terminal, the comparison circuit configured to toggle the second output terminal at the first threshold voltage and at the second threshold voltage; and
    wherein the first threshold voltage is greater than a bandgap voltage, and the scaling circuit includes:
      a first switch having a first current terminal, a second current terminal, and a first control terminal;
      a first resistor having a first resistor terminal and a second resistor terminal, the first resistor coupled between the first current terminal and the second current terminal; and
      a second resistor having a third resistor terminal and a fourth resistor terminal, the third resistor terminal coupled to the second resistor terminal.

13. The voltage supervisor of claim 12, wherein the scaling circuit includes:

a third resistor having a fifth resistor terminal and a sixth resistor terminal, the fifth resistor terminal coupled to the fourth resistor terminal;

a fourth resistor having a seventh resistor terminal and an eighth resistor terminal, the seventh resistor terminal coupled to the sixth resistor terminal; and a second switch having a third current terminal, a fourth current terminal, and a second control terminal, the third current terminal coupled to the seventh resistor terminal.

14. The voltage supervisor of claim 13, wherein the first switch comprises a P-channel metal-oxide-semiconductor field-effect transistor (MOSFET) and the second switch comprises an N-channel MOSFET.

15. The voltage supervisor of claim 13, wherein the comparison circuit includes:

a comparator having a negative input, a positive input and an output coupled to the first control terminal and the second control terminal;

a fifth resistor having a ninth resistor terminal and a tenth resistor terminal, the ninth resistor terminal coupled to the fourth resistor terminal and the fifth resistor terminal at a first node, the tenth resistor terminal coupled to the positive input; and a sixth resistor having an eleventh resistor terminal and a twelfth resistor terminal, the eleventh resistor terminal coupled to the ninth resistor terminal, the fourth resistor terminal, and the fifth resistor terminal, the twelfth resistor terminal coupled to the negative input.

16. The voltage supervisor of claim 12, wherein the scaling circuit includes:

a third resistor having a fifth resistor terminal and a sixth resistor terminal, the fifth resistor terminal coupled to the fourth resistor terminal;

a fourth resistor having a seventh resistor terminal and an eighth resistor terminal, the seventh resistor terminal coupled to the sixth resistor terminal; and a second switch having a third current terminal, a fourth current terminal, and a second control terminal, the third current terminal coupled to the seventh resistor terminal; and wherein the comparison circuit comprises:

a comparator having a first input, a second input, and an output, the output coupled to the first control terminal and the second control terminal;

a fifth resistor having a ninth resistor terminal and a tenth resistor terminal, the ninth resistor terminal coupled to the fourth resistor terminal and the fifth resistor terminal at a first node, the tenth resistor terminal coupled to the second input;

a sixth resistor having an eleventh resistor terminal and a twelfth resistor terminal, the eleventh resistor terminal coupled to the ninth resistor terminal, the fourth resistor terminal, and the fifth resistor terminal, the twelfth resistor terminal coupled to the first input;

a first transistor having a first current terminal, a second current terminal, and a first control terminal, the first current terminal coupled to the second input, the tenth resistor terminal, and the first control terminal at the first node;

a second transistor having a third current terminal, a fourth current terminal, and a second control terminal, the third current terminal coupled to the first input and the twelfth resistor terminal, and the second control terminal coupled to the first control terminal;

a seventh resistor having a thirteenth resistor terminal coupled to the fourth current terminal; and a logic gate having a logic gate input and a logic gate output, the logic gate input coupled to the output of the comparator.

17. The voltage supervisor of claim 12, wherein an analog block or a digital block is to operate at the first threshold voltage.

18. A method comprising:

activating a first switch and deactivating a second switch responsive to a comparator output state going high, the comparator output state connected to a control terminal of the first switch and a control terminal of the second switch;

generating a first voltage ratio and a first voltage corresponding to the first voltage ratio across a first resistor responsive to the first switch activating and the second switch deactivating;

in response to a supply voltage equaling a first threshold voltage, the first threshold voltage greater than a band-gap voltage:

generating a second voltage across a second resistor that is equal to or proportional to the first voltage across the first resistor;

comparing the first voltage and the second voltage;

toggling the comparator output state responsive to the comparison of the first voltage and the second voltage; and deactivating the first switch and activating the second switch to generate a second voltage ratio and a second threshold voltage responsive to the toggling of the comparator output state.

19. The method of claim 18, wherein the first voltage and the second voltage are equal at the first threshold voltage, and the first threshold voltage is insensitive to temperature variation, the method further including:

generating a third voltage across the first resistor corresponding to the second voltage ratio, in response to the supply voltage equaling the second threshold voltage;

generating a fourth voltage across the second resistor that is equal to or proportional to the third voltage across the first resistor;

comparing the third voltage to the fourth voltage, the third voltage and fourth voltage to be equal at the second threshold voltage, the second threshold voltage insensitive to temperature variation; and toggling the comparator output state responsive to the comparison of the third voltage to the fourth voltage.

20. The method of claim 18, further including generating hysteresis between the first threshold voltage and the second threshold voltage, the hysteresis based on the first voltage ratio and the second voltage ratio generated from the first switch and second switch and a plurality of resistors connected to the first switch and second switch, the hysteresis to be insensitive to temperature variation.

* * * * *